(12) United States Patent
Yeh et al.

(10) Patent No.: US 8,894,422 B2
(45) Date of Patent: Nov. 25, 2014

(54) SOCKET CONNECTOR WITH CONTACT TERMINAL HAVING WAVEFORM ARRANGEMENT ADJACENT TO TAIL PORTION PERFECTING SOLDER JOINT

(75) Inventors: Cheng-Chi Yeh, New Taipei (TW);
Nan-Hung Lin, New Taipei (TW);
Andrew Cheng, New Taipei (TW);
Chih-Pi Cheng, New Taipei (TW);
Shuo-Hsiu Hsu, New Taipei (TW);
Ting-Yao Hung, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/271,242

(22) Filed: Oct. 12, 2011

(65) Prior Publication Data

US 2012/0028502 A1      Feb. 2, 2012

Related U.S. Application Data

(63) Continuation-in-part of application No. 12/763,226, filed on Apr. 20, 2010, now Pat. No. 8,052,434.

(30) Foreign Application Priority Data

Jan. 13, 2011    (TW) ............................ 100200723 U

(51) Int. Cl.
| | |
|---|---|
| H01R 12/00 | (2006.01) |
| H01R 12/57 | (2011.01) |
| H01R 4/02 | (2006.01) |
| H05K 3/34 | (2006.01) |
| H05K 7/10 | (2006.01) |
| H01R 12/71 | (2011.01) |
| H01R 13/24 | (2006.01) |
| H01R 43/02 | (2006.01) |

(52) U.S. Cl.
CPC ................ *H01R 12/57* (2013.01); *H01R 4/024* (2013.01); *H01R 12/716* (2013.01); *H01R 13/2442* (2013.01); *H01R 43/0256* (2013.01); *H05K 3/3426* (2013.01); *H05K 7/1069* (2013.01); *H05K 2201/10325* (2013.01); *H05K 2201/10984* (2013.01); *H05K 2203/041* (2013.01)
USPC .......................................................... 439/83

(58) Field of Classification Search
CPC ......... H01R 4/024; H01R 4/023; H01R 4/027
USPC .................................................... 439/83, 876
See application file for complete search history.

(56) References Cited

U.S. PATENT DOCUMENTS

| 4,019,803 A | 4/1977 | Schell |
| 4,120,558 A | 10/1978 | Seidler |

(Continued)

FOREIGN PATENT DOCUMENTS

| CN | 2618319 Y | 5/2004 |
| CN | 2718822 Y | 8/2005 |

*Primary Examiner* — Felix O Figueroa
(74) *Attorney, Agent, or Firm* — Wei Te Chung; Ming Chieh Chang

(57) ABSTRACT

An electrical connector includes an insulative housing with a number of through holes extending therethrough, a number of contacts assembled to the insulative housing, and a number of solder balls disposed in the though holes and each is clasped by the tail and insulative housing. Each contact includes a vertical base portion secured to a first side of the through hole, a contact engaging arm extending from a top end of the base portion, and a solder portion extending from a bottom end of the base portion. The solder portion has a wave arrangement below the base portion and projecting from the base portion to a second side of the through hole which opposites to said first side, and a tail extending downwardly from the wave arrangement and capable of moving from the first side to the second side.

5 Claims, 33 Drawing Sheets

(56) References Cited

U.S. PATENT DOCUMENTS

| | | |
|---|---|---|
| 4,722,470 A | 2/1988 | Johary |
| 4,846,734 A | 7/1989 | Lytle |
| 5,453,017 A | 9/1995 | Belopolsky |
| 6,042,389 A | 3/2000 | Lemke et al. |
| 6,572,397 B2 | 6/2003 | Ju |
| 6,969,286 B1 | 11/2005 | Mongold et al. |
| 7,147,489 B1 * | 12/2006 | Lin .................. 439/83 |
| 7,278,864 B2 * | 10/2007 | Tsai .................. 439/83 |
| 2007/0293060 A1 | 12/2007 | Ju |

* cited by examiner

SOCKET CONNECTOR WITH CONTACT TERMINAL HAVING WAVEFORM ARRANGEMENT ADJACENT TO TAIL PORTION PERFECTING SOLDER JOINT

This application is a continuation-in-part of a patent application Ser. No. 12/763,226 entitled "Socket Connector With Contact Terminal Having Waveform Arrangement Adjacent To Tail Portion Perfecting Solder Joint" filed on Apr. 20, 2010 now U.S. Pat. No. 8,052,434.

FIELD OF THE INVENTION

The present invention relates to a socket connector, and more particularly to a socket connector incorporated with a contact terminal having a wave arrangement adjacent to a tail portion of the contact terminal so as to perfect solder joint resulting from this wave arrangement.

DESCRIPTION OF PRIOR ART

Soldering between a solder tail of a contact terminal and a conductive pad on a printed circuit board is comparably reliable and common practice in the electrical connector field. When conducting a soldering process, there is s dilemma. At one hand, it is requested that the solder tail expresses solderable property, i.e. the solder can be readily and easily attached thereto. If the solder joint is not properly formed between the solder tail and the printed circuit board, defective interconnection or so called cold-joint will be encounter. Rework process will always be needed to correct this problem. On the other hand, because of this solderable property, the solder tends to flow upward or wick along an external surface of the solder tail. Once the solder flows and wicks upwardly along the surface resulted from the capillary force, the overall characteristic of the contact terminal will be changed or negatively modified. For example, when the contact terminal is designed, intended normal force, deflection, etc have been carefully calculated so as to meet the field requirements. Once the solder flows and wicks upward to cover the contact terminal, the characteristic of the contact terminal will be altered, and the normal force and other properties will be altered accordingly. In worse sinario, a connector after soldering will be found failed resulted from this solder wicking. As a result, the contact terminal is requested to provide a mechanism to limit the wicking.

U.S. Pat. No. 4,019,803 issued to Schnell on Apr. 26, 1977 disclosed a solder substrate clip having a contact arm. A mass of solder is secured to the arm on a side away from a contact surface and a solder globule integral with the mass of solder at an edge of the arm extending from the mass across the edge of the arm to the contact surface for engagement with a contact pad on the substrate.

U.S. Pat. No. 4,846,734 issued to Lytle on Jul. 11, 1989 discloses a connector featuring that a connector adapted to be attached to a mother printed circuit board and to removably receive a daughter printed circuit board of the edge card type and adapted to mechanically and electrically couple the mother and daughter printed circuit boards. According to its disclosure, the invention may be incorporated into a method to make the contact terminal and which further includes the step of fabricating the contact of phosphor bronze. The method further includes the step of plating the contact with nickel to a thickness of about between 0.000050 and 0.000150 inches. The method further includes the step of plating the lower portion of the contact with solder of about 60 percent tin and 40 percent lead to a thickness of about between 0.000100 and 0.000500 inches. The method further includes the step of plating the contact portion of the contact with about 40 microinches thick or thicker of PdNi flashed with gold to a thickness of about 0.000004 inches nominally. It is known to the skilled in the art that tin-lead is solderable material, while nickel oxide is non-solderable. Because of that, a tin-lead coating is applied to the lower portion.

U.S. Pat. No. 5,453,017 issued to Belopolsky on Sep. 26, 1995 expressivebly take the advantage of the benefit disclosed in Lytle. In Belopolsky, it discloses an improved connector for an electronic module or the like and includes a housing having a socket opening that is sized and configured to accept an electronic module, and a plurality of terminals mounted to the housing. Each of the terminals has a foot portion having a layer of non-solderable material coated on one side of the foot portion to prevent solder from adhering to that side. A capillary nest is formed by a channel surface on the underside of the foot portion when the terminal is mounted on a conductor pad such that solder flows through the capillary nest under the influence of capillary forces from the side of the terminal having a non-solderable coating thereon to the other side for forming a solder joint on that other side. A ring of non-solderable material is coated around a middle portion of the terminal to prevent solder from flowing to the electrical contact surfaces located above the ring. As a result, the connector terminals can be soldered to a printed circuit board or the like in a simple and inexpensive manner and without the formation of known solder defects. As disclosed by Belopolsky, solderable material used in capillary nest is to promote solderability on the solder tail, while the non-solderable ring located at the middle portion limits the solder from wicking further upward.

U.S. Pat. No. 4,722,470 issued to Johary on Feb. 2, 1988 discloses another mechanism to overcome or control the solder wicking. According to Johary, a solder transfer member for applying discrete bodies of solder of predetermined size to the leads of a component for subsequent surface mounting to a substrate. The transfer member is a plate having a non-wetted surface, for example titanium, with an array of cavities matching the component lead pattern, each having a volume corresponding to the desired amount of solder to be applied to the corresponding lead. The method includes placing solder paste on the transfer member and filling the cavities by wiping the plate surface. The component is placed on the transfer member with the leads contacting the solder paste in the cavities. Reflow of the solder paste bonds to each lead a discrete body of solder having a precisely determined size. To limit wicking of solder on the leads, selective masking may be performed by applying a water soluble mask coating to the leads and removing the mask from selected areas by placing the component against a surface charged with water before placing the component on the transfer member.

U.S. Pat. No. 6,042,389 issued to Lemke on Mar. 28, 2000 disclosed another mechanism to limit the solder wicking issue. According to FIG. 6, along with description, "The opening 96 also can function as a thermal break to retard solder wicking, in the same manner as openings 89 in the FIG. 6 embodiment. The terminal 90 may also include passivation or anti-wicking coatings to prevent solder flow toward the contact sections. Aperture or opening 89 defined in the contact tail 76 is used to limit the wicking issue."

U.S. Pat. No. 4,019,803 issued to Schnell on Apr. 26, 1977 discloses a solder substrate clip having a contact arm, a mass of solder secured to the arm on a side away from a contact surface and a solder globule integral with the mass of solder at an edge of the arm extending from the mass across the edge of the arm to the contact surface for engagement with a contact pad on the substrate. According to its description, along with FIGS. 1 to 4, it looks like that Schnell uses energy to control the wicking issue. According to Schnell, the amount of energy supplied to the interface between the solder mass and the arm is sufficient to melt the entire mass, in that way assuring that a relatively large mass of molten solder does not coat the contact surface of the arm. While molten solder does not readily flow across the raw uncoated edges, a relatively large amount of molten solder could flow across the edges and coat the contact surface. This is undesirable because when a substrate is moved into the mouth the arms are bent further apart than intended due to the thickness of the solder coating and may be overstressed. During soldering of the clip to the substrate, the thick layer of solder would be melted freeing the arms for undesired movement during the soldering operation. Overstressed arms may not be strong enough to engage the substrate tightly.

U.S. Pat. No. 4,120,558 issued to Seidler on Oct. 17, 1978 discloses another way, as compared to Lemke and Schnell, to attach the solder mass to the contact. Seidler uses spring fingers to mechanically hold the solder mass, such as shown in FIGS. 1 to 5, and 13 to 15. According to Seidler, each clip includes a flat body portion 15, a pair of spring fingers 16, bent to extend upwardly and laterally from the plane of the body portion distally of the clip and spaced apart by the width of a central spring finger 17 which extends laterally in a position spaced from and substantially parallel to the fingers 16, defining a gap 21 adapted to receive the edge of a substrate (not shown). The fingers 16 and 17 are formed from the blank shown in FIG. 4 by the parallel cuts 18 which terminate at end points 18'. An additional gripping finger 19 is provided by the U-shaped cut 20, the sides of which lie parallel to the cuts 18 and the closed end 20' being below the line of the ends 18', this finger thus being formed partially from the material in the central finger 17. The free end of the finger 17 is curved arcuately away from the finger 16, and the gripping finger 19 is curved arcuately toward the curved end of finger 17, in a position to grip securely the short cylindrical slug of solder 22, as clearly shown in FIGS. 1, 2 and 3.

U.S. Pat. No. 6,969,286 issued to Mongold on Nov. 29, 2005 discloses another type of mechanism to attach the solder mass to the solder tail. According to Mongold, an electrical connector includes a connector body, a plurality of cores and a plurality of electrically conductive contacts disposed in the cores of the connector body. Each of the contacts includes a fusible member attached thereto. Each of the fusible members includes an intermediate portion and two support members disposed on opposite sides of the intermediate portion. The support members are arranged to hang down below a tail portion of the contacts. As illustrated in FIG. 1B, it looks like the solder mass 40a, 40b is attached to the contact terminal 22 in a manner of a landing gear of an airplane. According to Mongold, each fusible member 40 has two support portions 40a, 40b which are connected to each other by an intermediate portion 40c. The two support portions 40a, 40b are disposed opposite to each other and spaced from each other by a distance that is equal to a length of the intermediate portion 40c. The two support portions 40a, 40b may preferably have substantially flattened bottom surfaces as shown in FIG. 1B. However, the bottom surfaces of the support portions 40a, 40b may also have other shapes such as rounded, spherical, conical, square, rectangular, and other suitable shapes.

Chinese Utility Model Patent No. CN2618319Y published on May 26, 2004 discloses an arrangement in which both the contact and housing is used to hold the solder mass thereto. This arrangement is similar to what illustrated by Seidler, and Schnell, while the housing of the connector body is also used.

U.S. Pat. No. 6,572,397 issued to Ju on Jun. 3, 2003 discloses another arrangement in which the solder mass is held by a cuverlinear portion of a solder tail.

US Pat Pub No. 20070293060 submitted by Ju discloses another arrangement in which a cradle-shaped portion is used to hold the solder mass.

Chinese Utility Model Patent No. CN2718822Y published on Aug. 17, 2005 discloses an arrangement in which two contact terminals are arranged within a single passageway and a solder ball is held by two solder tails of the contact terminals.

SUMMARY OF THE INVENTION

It is an object of the present invention to provide a connector socket with an array of contact terminals arranged therein and featured that each of the contact terminal is provided with a curvilinear tail portion and an encampment adjacent to a passageway such that a solder mass can be readily and reliably positioned therebetween.

Disclosed herewith An electrical connector comprises an insulative housing having opposite upper and lower surfaces and a plurality of through holes extending through the upper surface to the lower surface; a plurality of contacts assembled to the insulative housing; and a plurality of solder balls disposed in the though holes and each is clasped by the tail and insulative housing. Each contact includes a vertical base portion secured to a first side of the through hole, a contact engaging arm extending from a top end of the base portion, and a solder portion extending from a bottom end of the base portion, said solder portion including a wave arrangement below the base portion and projecting from the base portion to a second side of the through hole which opposites to said first side, and a tail extending downwardly from the wave arrangement and capable of moving from the first side to the second side.

Still according to one of the aspects of the present invention, The through hole comprises an upper passageway and a lower retaining slot communicated with each other. A plurality of solder members each is secured by one side of the retaining slot and the tail. The tail and the other side of the retaining slot define a deforming space so that the tail can move to the other side of the retaining slot to dispose the solder member.

BRIEF DESCRIPTION OF DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF PREFERRED EMBODIMENT

Figure 1:
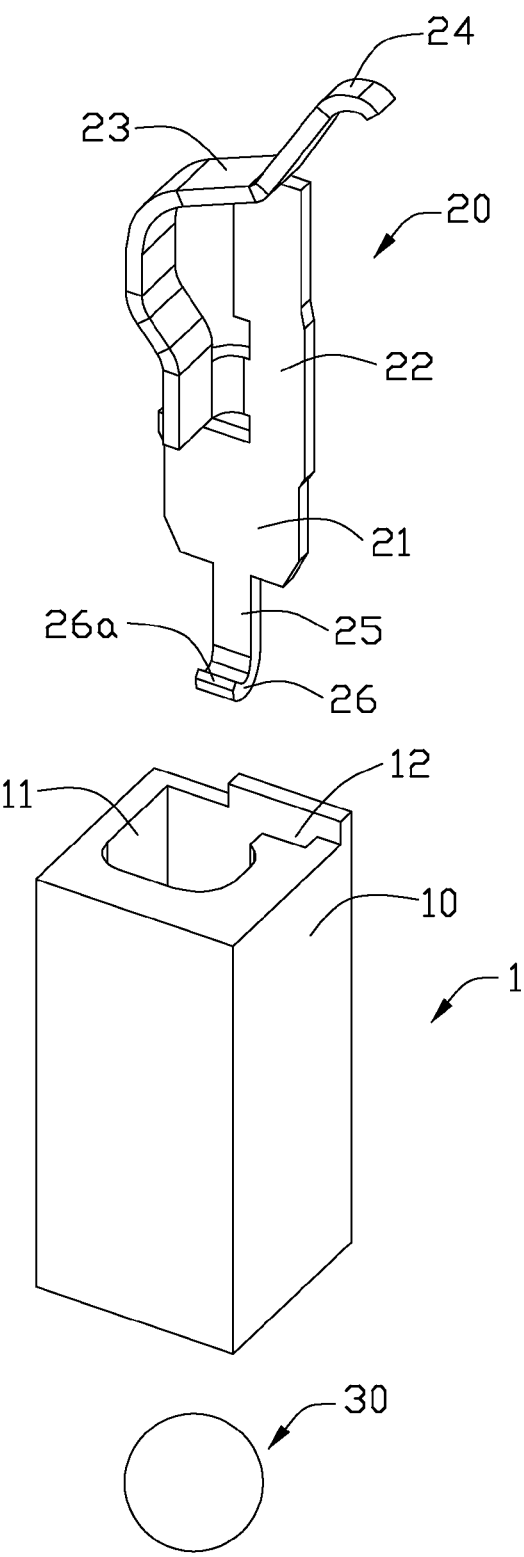
FIG. 1 is an exploded perspective view of a partially-shown socket connector made in accordance with a first embodiment of the present invention.

Referring to FIG. 1, a partially-shown socket connector 1 made in accordance with a first embodiment is shown. In generally, the socket connector 1 is substantially similar to the U.S. Pat. No. 6,877,990 issued to Liao et al. on Apr. 12, 2005; U.S. Pat. No. 6,908,313 issued to Walkup et al. on Jun. 21, 2005, which are both referred to as LGA socket connector. For a clear and concise description, only a single passageway 10, a single contact 20 and a solder ball 30 are disclosed, as it can be merely duplicated into an array of socket connector such as described in U.S. Pat. No. 7,044,746 issued to Copper et al. on May 16, 2006.

Figure 1A:
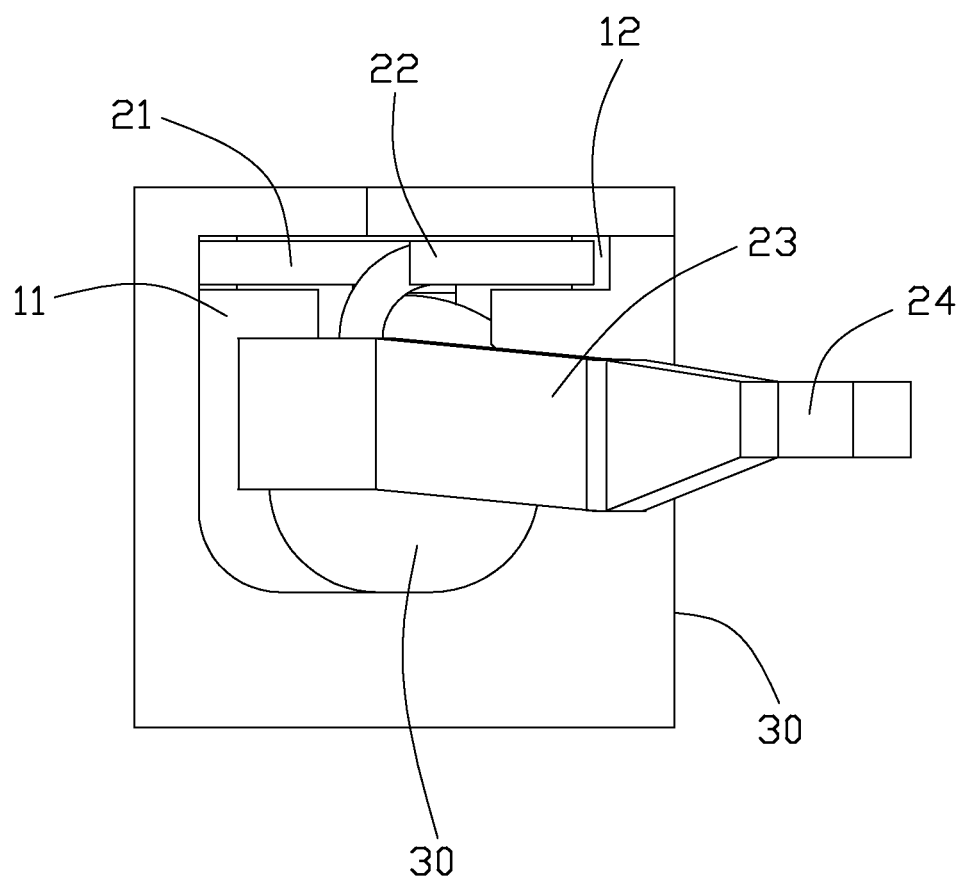
FIG. 1A is a top view of the socket connector shown in FIG. 1.
Figure 2:
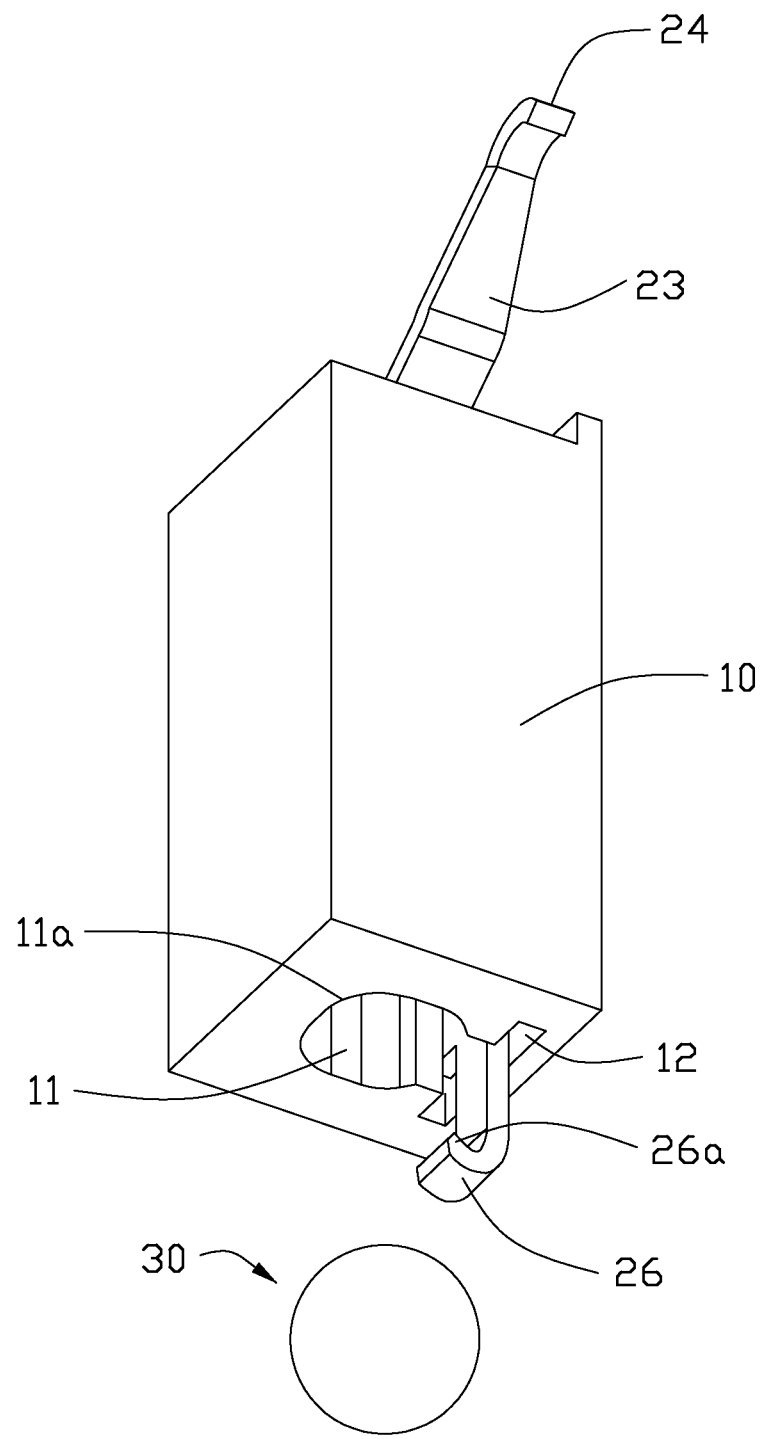
FIG. 2 is a perspective view of the partially-shown socket connector taken from a bottom and showing a contact has been assembled into the socket connector, while the solder ball is still unsecured thereto.
Figure 3:
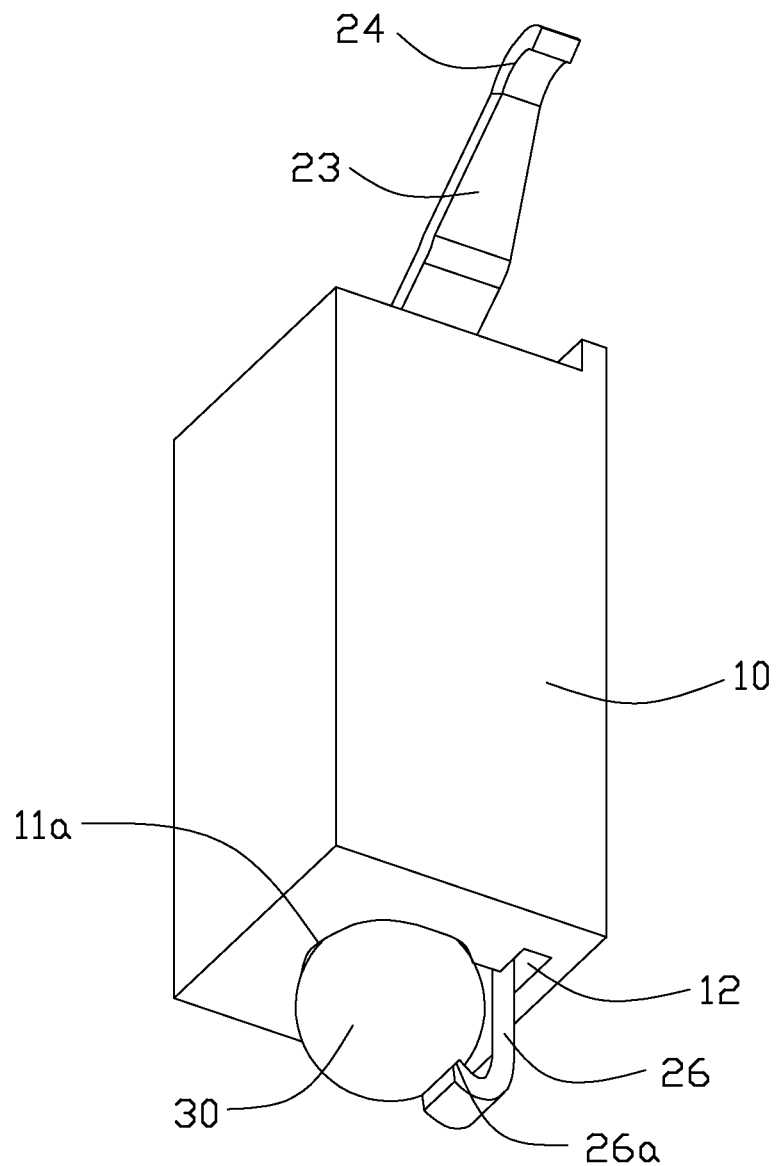
FIG. 3 is similar to FIG. 2, only with the solder ball secured between a solder tail of the contact and an edge of a passageway of the socket connector.

As shown in FIGS. 1 and 1A, the socket connector 1 includes an insulative housing 10 defining an array of passageways 11 which has a retaining slot 12 in communication with the corresponding passageway 11. Within each and every passageway 11, a contact terminal 20 is assembled therein. The contact terminal 20 includes a base portion 21 with a retaining section 22 extending therefrom, and which are both securely retained within the retaining slot 12. A contact engaging arm 23 extends from the retaining section 22 which further includes a contact tip 24 for electrical contact with a conductive pad of an IC package. The extension of the contact engaging arm 23 from the retaining section 22 give a robust flexibility of the contact engaging arm 23 when which is in contact with the conductive pad. The contact terminal 20 further includes a solder portion 25 extending downward from the base portion 21, and a curvilinear lobe 26 having a tip 26a is formed. A solder ball 30 is then snuggly secured between an edge 11a of the passageway 11 and the tip 26a of the solder tail 26. See FIGS. 3, 4 and 5.

Figure 4:
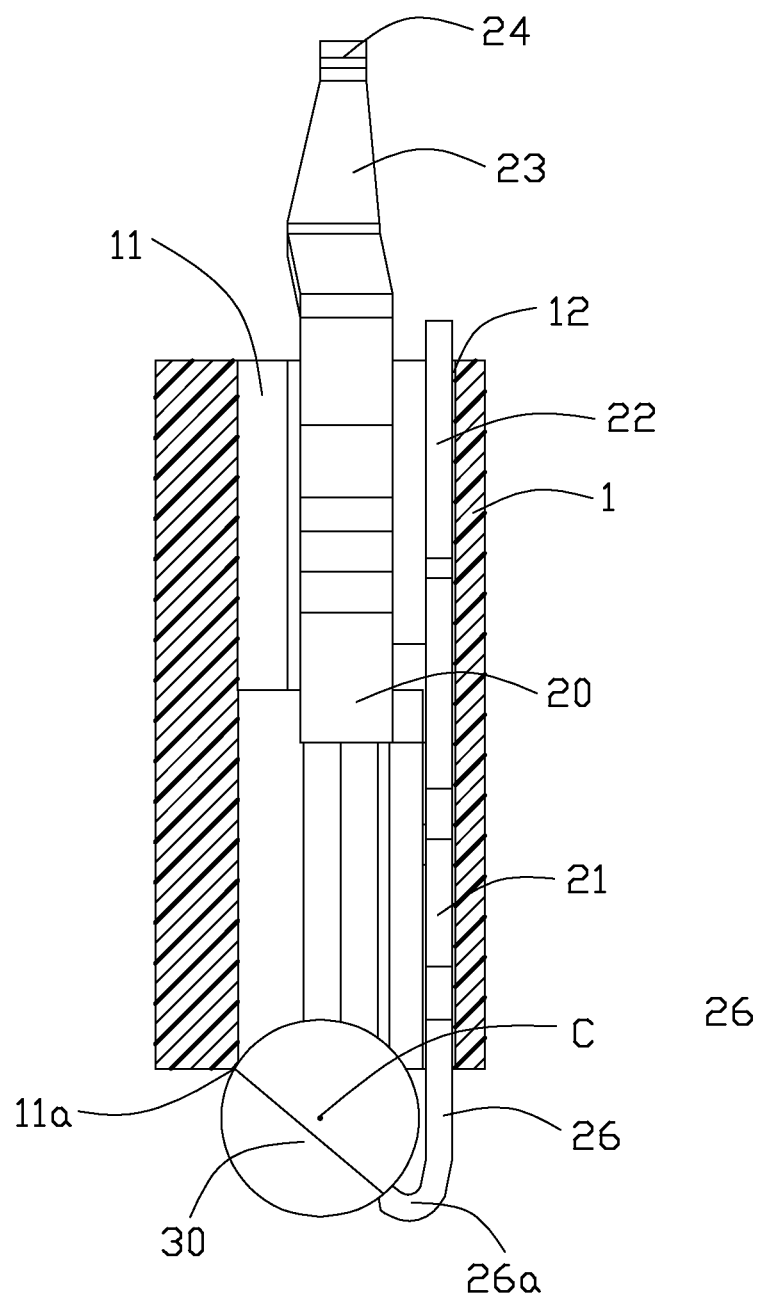
FIG. 4 is a cross sectional view of the partially-shown socket connector showing the solder ball is securely retained between the solder tail of the contact and the edge of the passageway of the socket connector.

As it can be readily seen from the illustration of FIG. 4, the base portion 21 and the retaining section 22 are both securely retained within the retaining slot 12, while the contact engaging arm 23 is partially disposed within the passageway 11 and partially extends out of the passageway 11, specially the contact tip 24. In order to have the solder ball 30 securely retained there, a center C of the solder ball 30 is disposed above a line drawn between the tip 26a of the curvilinear lobe 26 and the edge 11a of the passageway 11. After the solder ball 30 is secured, portion of the solder ball 30 extends into the passageway 11.

Figure 6:
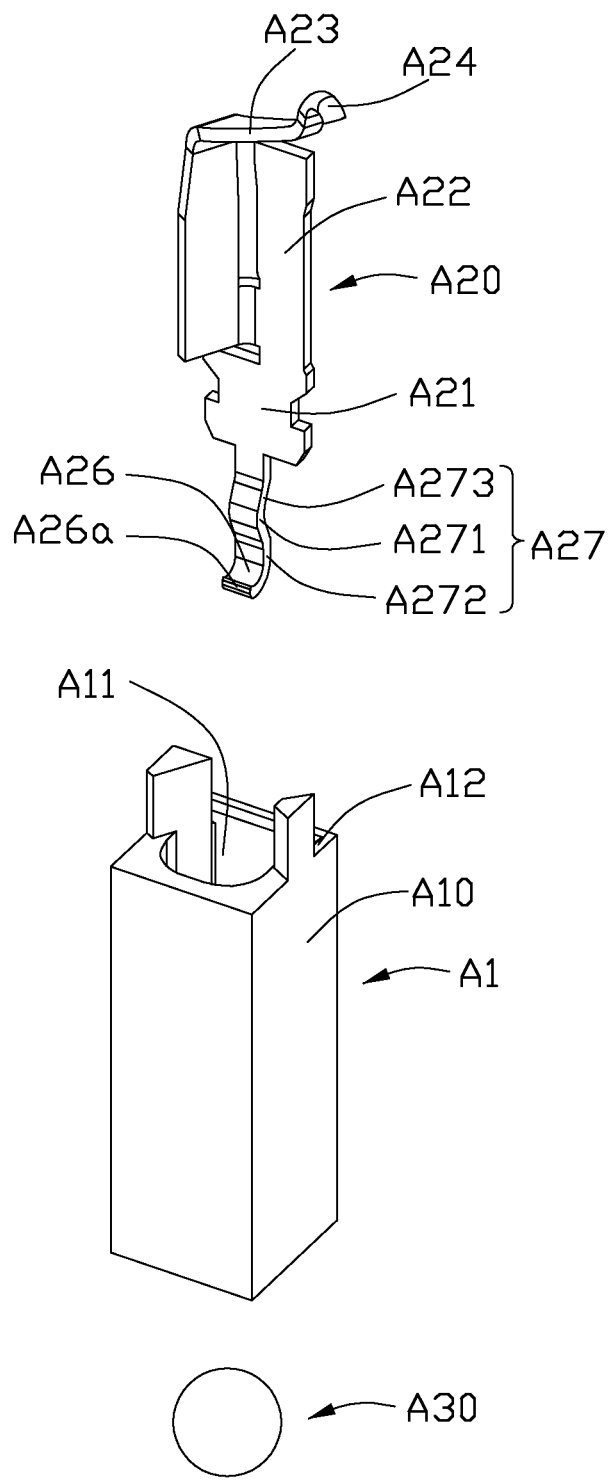
FIG. 6 is an exploded perspective view of a partially-shown socket connector made in accordance with a second embodiment of the present invention.
Figure 6A:
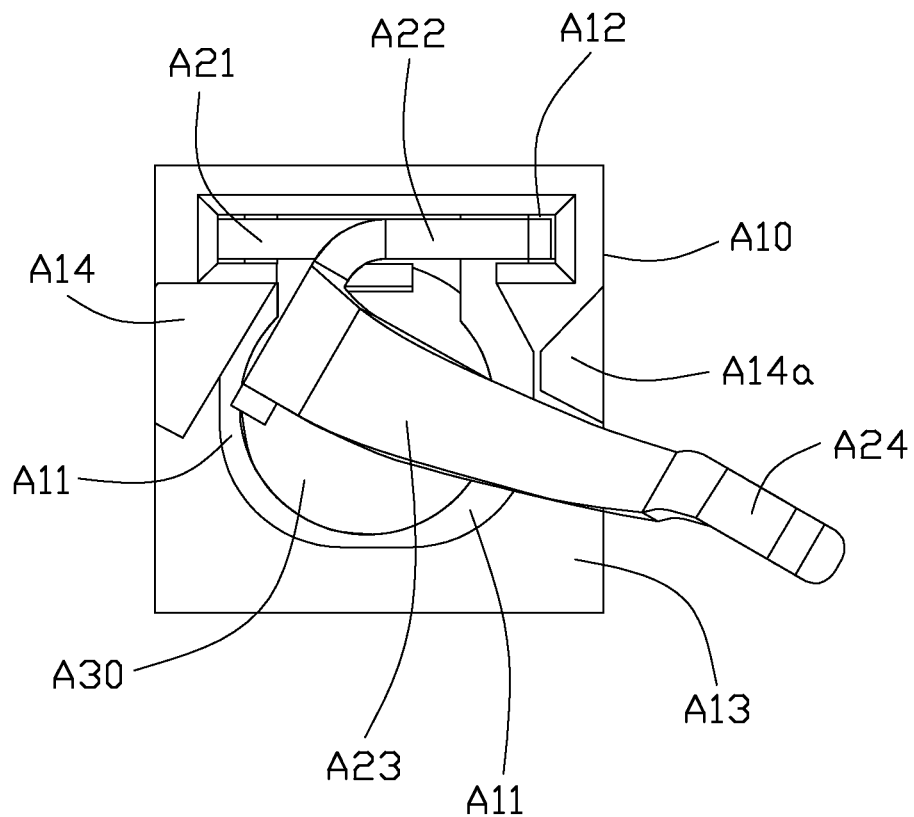
FIG. 6A is a top view of the socket connector shown in FIG. 6.
Figure 6B:
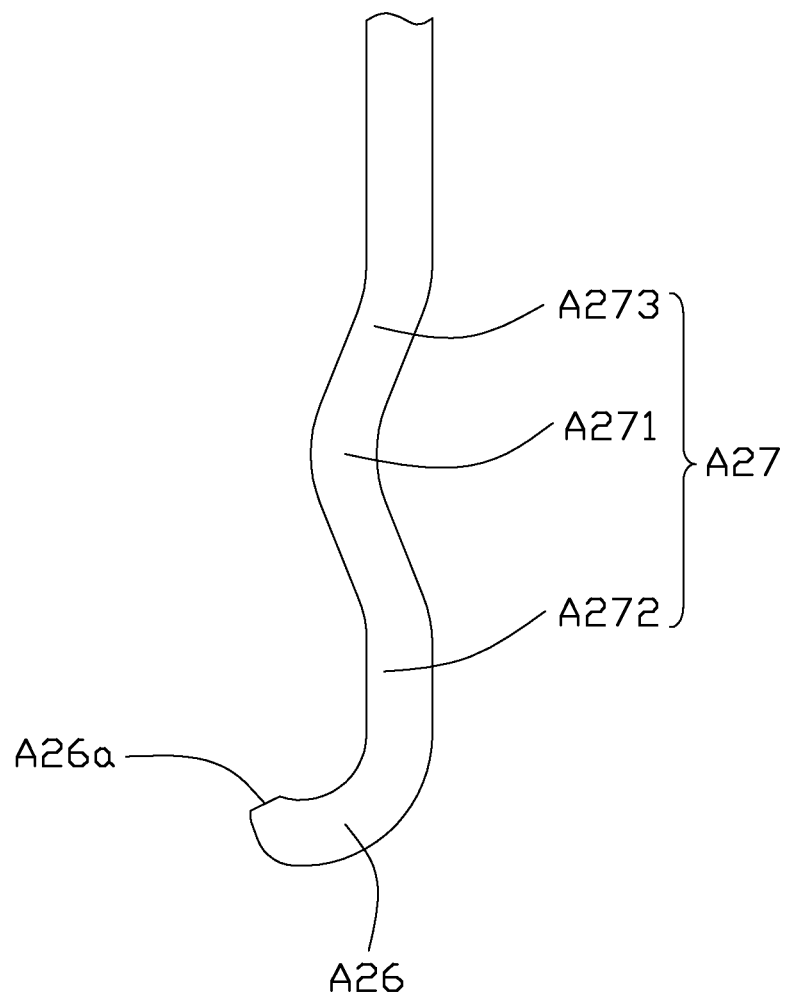
FIG. 6B is a side view of a solder portion of a contact terminal of the socket connector shown in FIG. 6.
Figure 7:
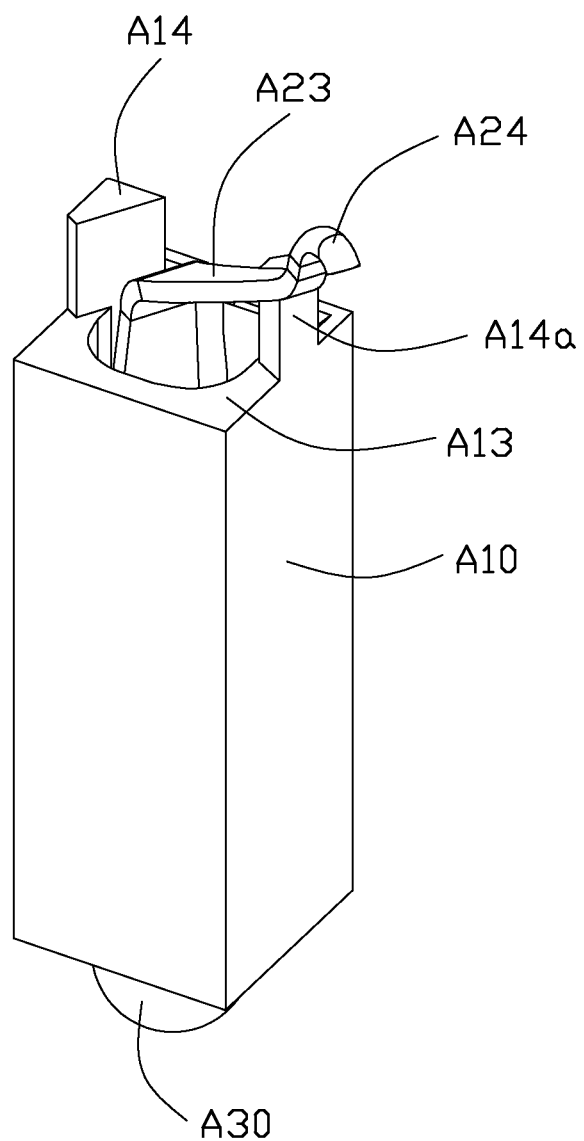
FIG. 7 is an assembled view of the partially shown socket connector in FIG. 6.
Figure 8:
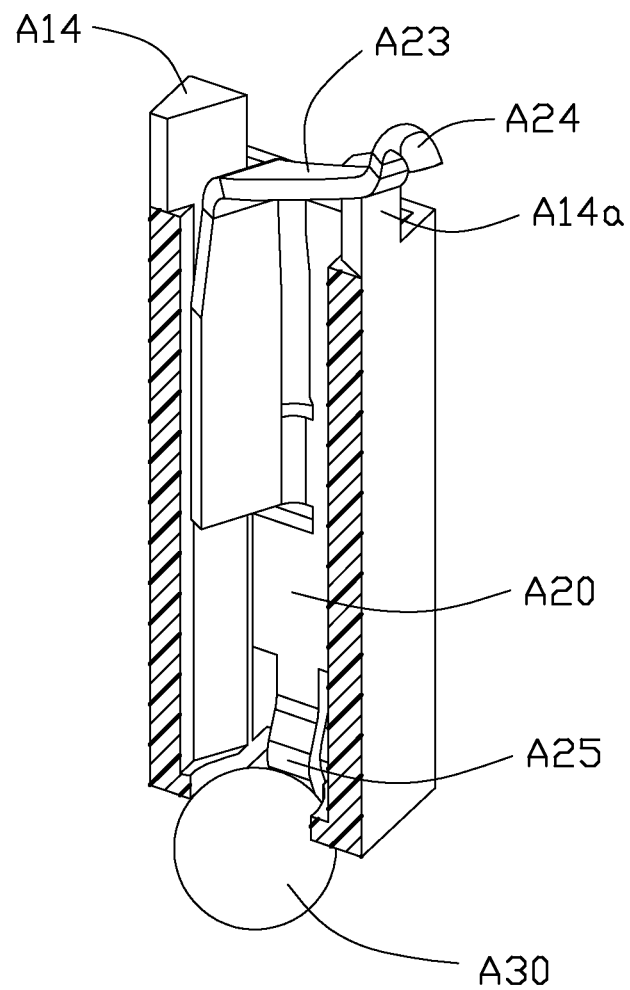
FIG. 8 is a cross sectional view showing a solder ball is held between edges and a solder tail of the contact terminal shown in FIG. 6.

Now referring to FIGS. 6 through 10, a partially-disclosed socket connector A1 made in accordance with a second embodiment is shown. As shown in FIGS. 6 and 6A, the socket connector A1 includes an insulative housing A10 defining an array of passageways A11 which has a retaining slot A12 in communication with the corresponding passageway 11. Within each and every passageway A11, a contact terminal A20 is assembled therein. Similar to the contact terminal 20 shown in the first embodiment, the contact terminal A20 includes a base portion A21 with a retaining section A22 extending therefrom, and which are both securely retained within the retaining slot A12. A contact engaging arm A23 extends from the retaining section A22 which further includes a contact tip A24 for electrical contact with a conductive pad of an IC package. The extension of the contact engaging arm A23 from the retaining section A22 give a robust flexibility of the contact engaging arm A23 when which is in contact with the conductive pad. The contact terminal A20 further includes a solder portion A25 extending downward from the base portion A21, and a curvilinear lobe A26 having a tip A26a is formed. A solder ball A30 is then snuggly secured between an edge A11a of the passageway 11 and the tip A26a of the solder tail A26. In this embodiment, the edge A11a is a curvilinear edge. The housing A10 further includes a mating interface A13 with a pair of standoff A14 and A14a associated with each of the passageway A11. The provision of the standoff A14 and A14a will prevent the contact engaging arm A23 from collapsing in case excessive work load is inadvertently exerted to the contact engaging arm A23.

Figure 9:
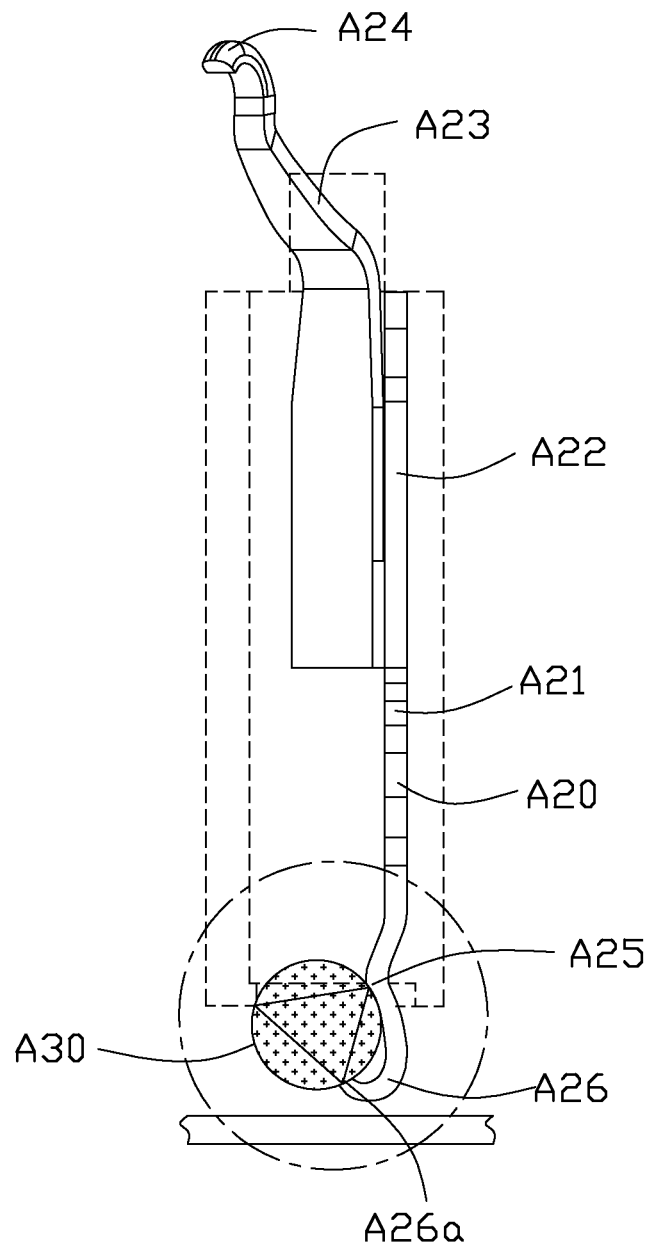
FIG. 9 is a side elevation view of the contact terminal along with the solder ball retained, while the insulative housing is shown in dotted line.
Figure 9A:
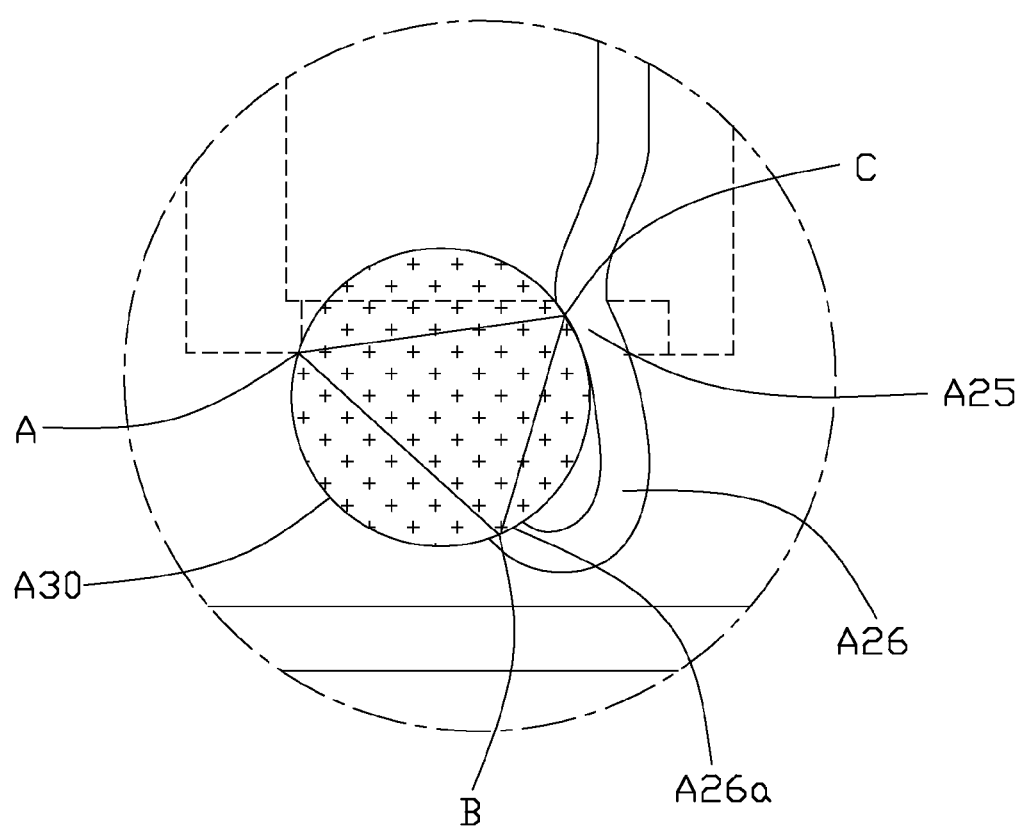
FIG. 9A is an enlarged view of a part of the contact terminal in FIG. 9 marked with circle.
Figure 10:
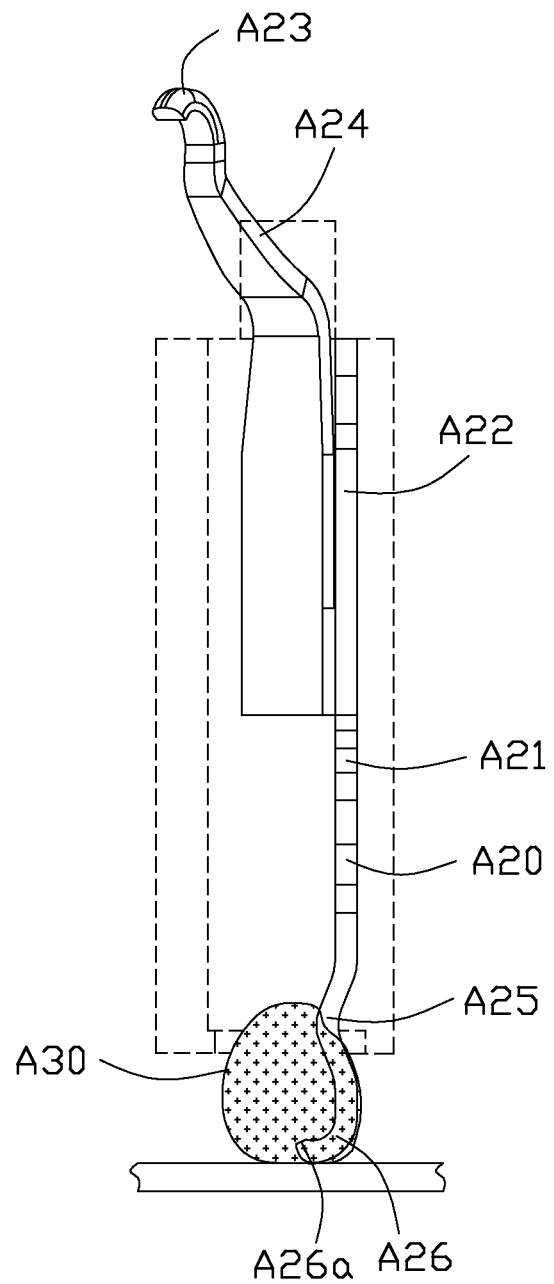
FIG. 10 is similar to FIG. 9 with the solder ball reflowed, and creating a tear-drop shaped solder joint embedding the curvilinear lobe of the contact terminals, the first slope, and portion of the peak of the wave arrangement.

Now specially draw to the attention of FIGS. 9 and 10, the solder portion A25 includes a wave arrangement A27 in a middle thereof and which includes a peak A271, a first slope A272 and a second slope A273. Since the peak A271 projects toward the solder ball A30, accordingly, an edge A301 of the solder ball A30 is substantially surrounded by the peak A271, the first slope A272, and the tip A26a of the cuviliner lobe A26. By this arrangement, the contact area between the solder portion A25 and the solder ball A30 is preferably increased and which benefits a later surface mount process in which the socket connector A1 is soldered onto a printed circuit board.

The wave arrangement A27 in fact benefits the formation of an ideal solder joint, as shown in FIG. 10, i.e. a tear-drop shaped solder joint, a comparably enlarged base, while a convergent top. During the reflowing process, once the solder ball A30 is liquidated or in liquid form, the surface tension will draw the molten solder to flow along the first slope A272 and this capillary action will ensure that the first slope A272 along with the curvilinear lobe A26 to be completely embedded within the solder joint which featured an enlarged base. However, once the molten solder flows to the peak A271, because of the second slope A273 is opposite to the first slope A272 or symmetrical to the first slope A272 centered on the peak A271, the surface tension of the molten solder will not benefit the molten solder to flow further upward, i.e. the molten solder will be substantially limited to flow further upward around the peak A271. Accordingly, not only will the wave arrangement A27 feature a robust and reliable solder joint, but also will provide wicking retarding effect.

Specially, as shown in FIG. 9, the peak A271, the tip A26a of the curvilinear lobe A26 and the edge A11a of the passageway A11 configure jointly an equilateral triangle as seen from side elevational view, and most of the solder ball A30 is disposed within this equilateral triangle, no mention that the center of the solder ball A30 is also located within this equilateral triangle.

In this embodiment, it can be readily appreciated that curvilinear edge A11a and curvilinear lobe A26 properly cradle the solder ball A30 therebetween. In fact, the curvilinear edge A11a provides a horizontal support or limitation, while the curvilinear lobe A26 along with the peak A271 of the wave arrangement A27 provides a vertical support or limitation. Accordingly, the solder ball A30 is securely and robustly cradled between those two curvilinear supports, i.e. curvilinear edge A11a, and curvilinear lobe 26. Because the solder ball A30 is held between two curvilinear edges, the deformation or damage to the solder ball A30 during this mechanic ball attachment process is tremendous reduced, and which benefits and perfects a robust and reliable solder joint, the tear-drop solder joint such as disclosed in FIG. 10.

Now referring to FIGS. 11 to 14, a socket connector B1 made in accordance with a third embodiment of the present invention. In this embodiment, a mating interface B13 of the insulative housing B10 is provided with a standoff B14 associated with the tip B24 of the contact engaging portion B23. The provision of the standoff B14 is to prevent the contact engaging portion B23 from collapsed resulted from excessive load from the IC package. From the top view of FIG. 11A, it can be readily appreciated that each tip B24 of the contact engaging portion B23 is associated with the standoff B14.

As disclosed in the first and second embodiments, after the solder ball 30 (A30) is secured between the housing 10 (A10) and the solder portion 25 (A25), a portion of the solder ball 25 (A25) is disposed within the passageway 11 (A11). In fact, the more the solder ball 30 (A30) is disposed within the passageway 11 (A11), the more secured relationship between the solder ball 30 (A30), the edge 11a (A11a) of the passageway 11 (A11), and the tip 26a (A26a) of the curvilinear lobe 26 (A26). However, this creates a problem for the solder ball 30 (A30) to move into final position. Accordingly, measurement has been provided to resolve this issue.

Figure 12:
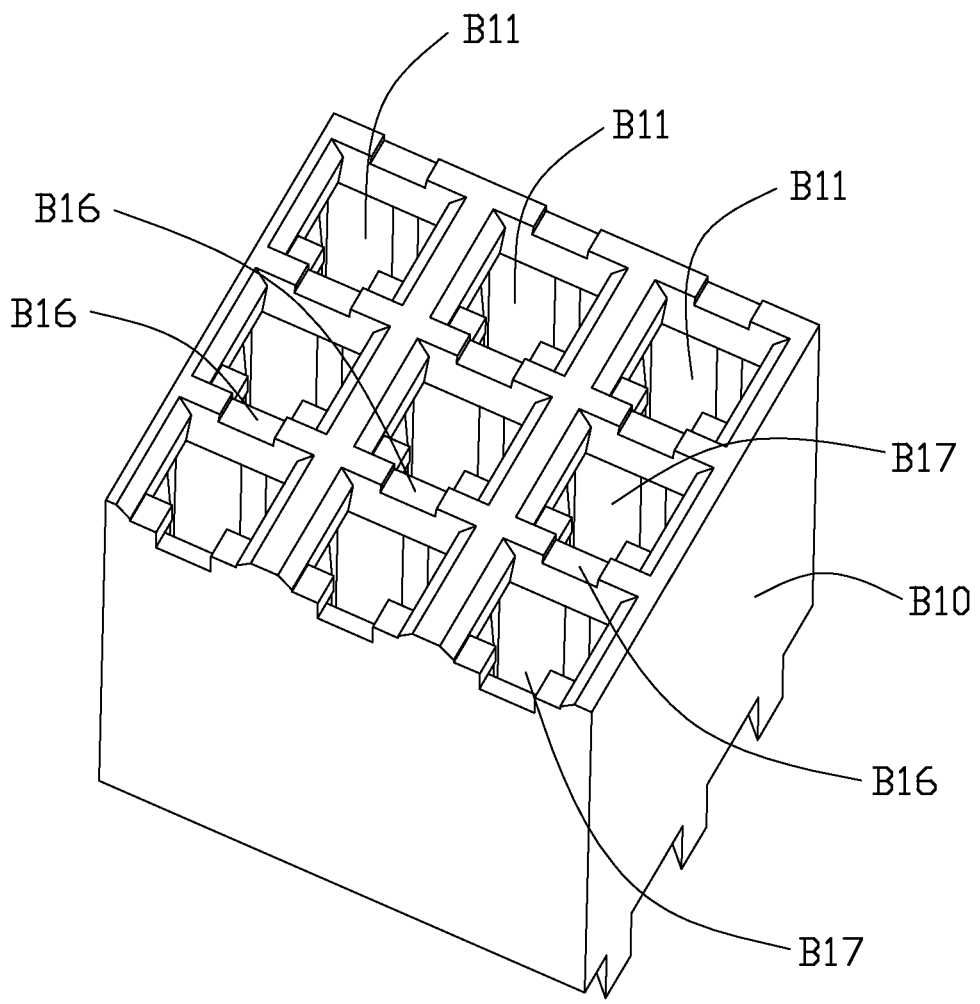
FIG. 12 is a perspective bottom view of the insulative housing shown in FIG. 11.
Figure 13:
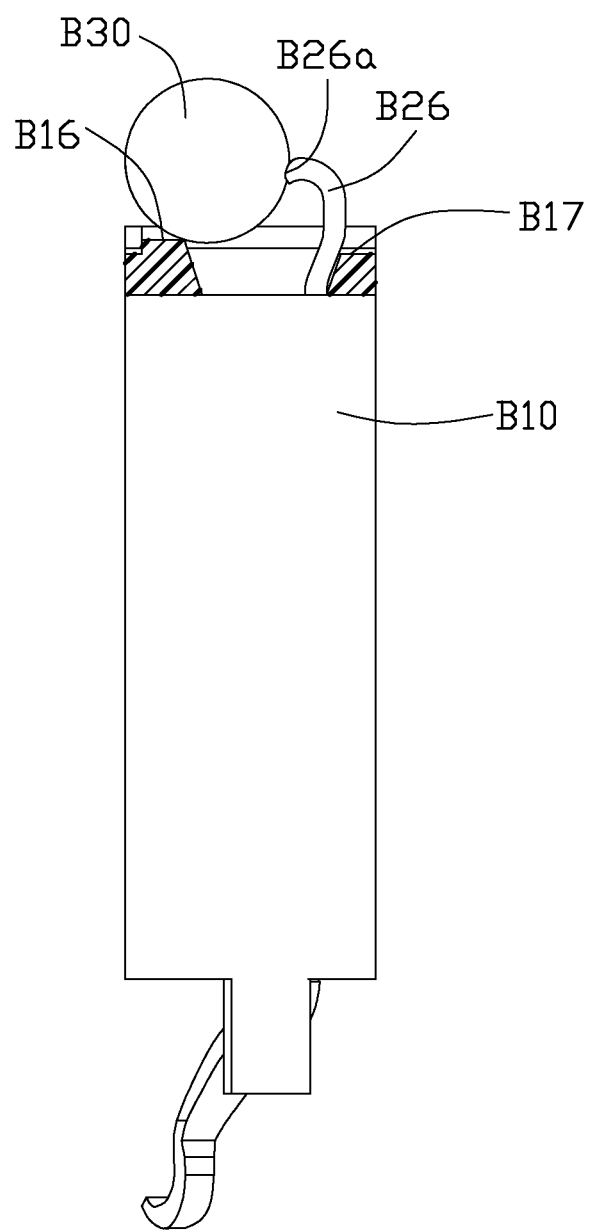
FIG. 13 is an illustration showing the solder ball is reaching to a position defined between the curvilinear lobe and the housing.
Figure 14:
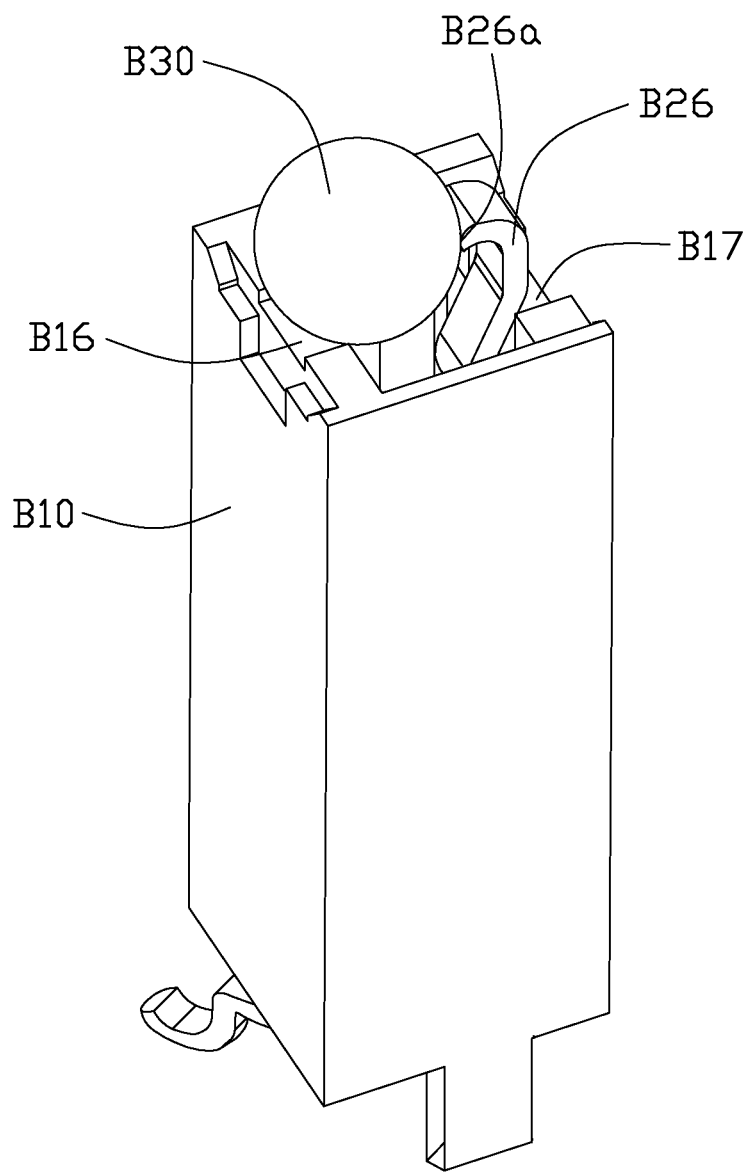
FIG. 14 is similar to FIG. 13, while the solder ball reaches to its final position.
Figure 15:
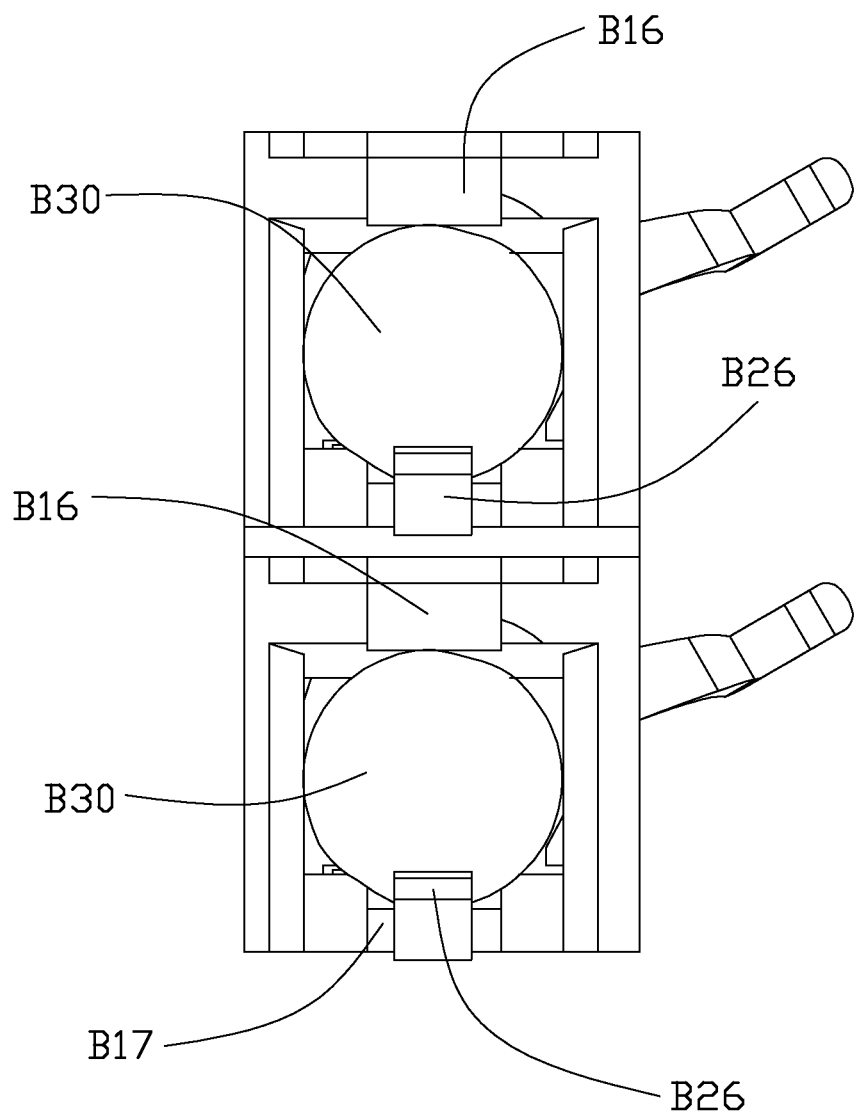
FIG. 15 is a top view of FIG. 11 with a pair of contact terminals is shown.

Now referring to FIGS. 12, 13 and 14, the insulative housing B10 of the socket connector B1 made in accordance with a third embodiment of the present invention defines a mounting interface B15 and a ball notch B16 is provided in adjacent to the passageway B11. Accordingly, when the solder ball B30 is inserted into the space defined between the edge B11a of the passageway B11, the peak B271 and the tip B26a of the curvilinear lobe B26, the ball notch B16 will smooth the insertion of the solder ball B30. On the other hand, an inner wall of the passageway B11 adjacent to the solder portion B26 is defined with a recess B17 for the yielding of the solder portion B26 when the solder ball B30 is reached to its final position, such as shown in FIGS. 14 and 15. Since the contact terminal B20 is made from resilient material, during the reflowing process, once the solder ball B30 reaches to its molten state, when the solder portion B26 will resume to a proper position, such as illustrated in FIG. 10, a perfect teardrop solder joint with the solder portion B26 properly embedded within the solder joint.

According to another feature of the third embodiment of the socket connector B1, an inclined surface B18 runs between the lower edge B11a and an inner wall of the passageway B11 in a manner such that the solder ball B30 can be readily and effectively move into its final position, as shown in FIGS. 12, 13 and 14. By this arrangement, not only can the sitting of the solder ball B30 be readily done, but also provide a surface contact between the solder ball B30 and the inclined surface B18.

Figure 16:
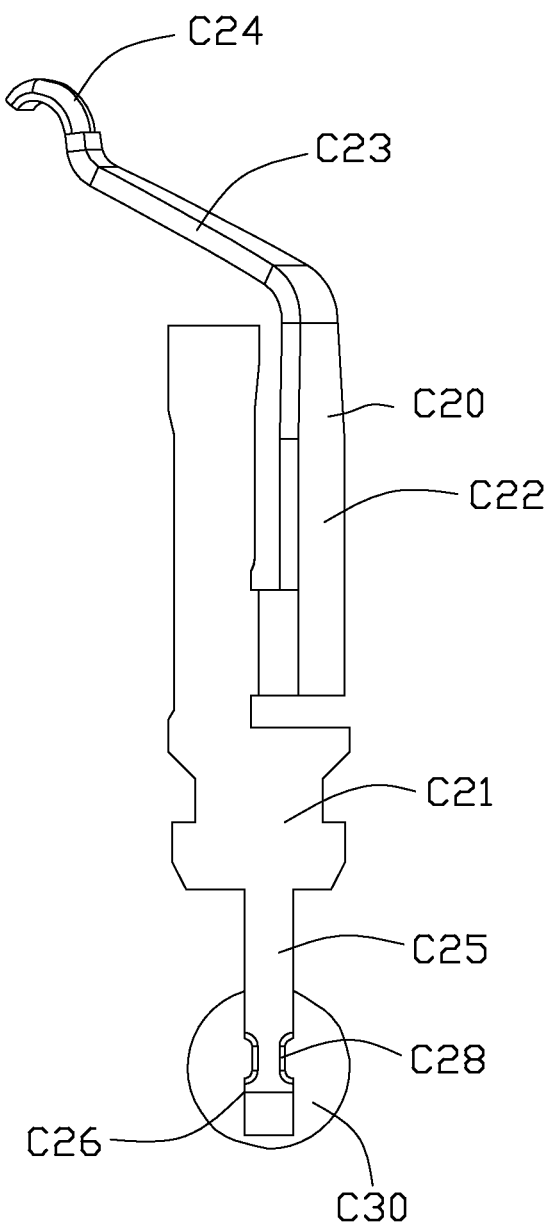
FIG. 16 is a side elevational view of a contact terminal made in accordance with a fourth embodiment of the present invention showing a solder notch is defined in the solder portion.
Figure 17:
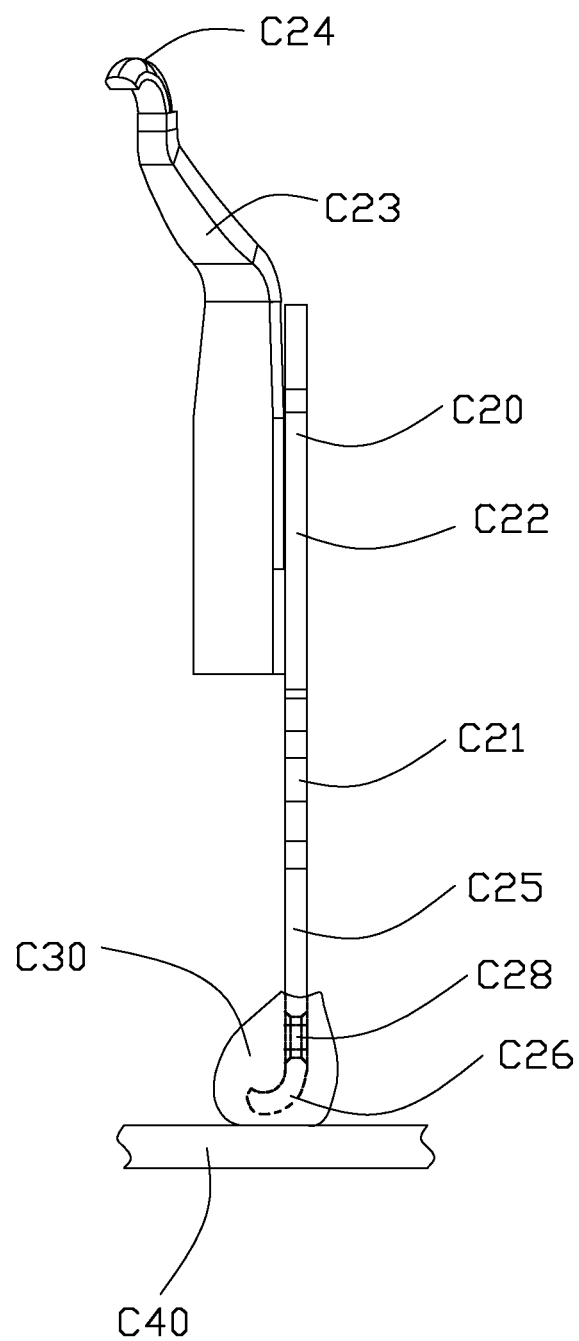
FIG. 17 is a also a side elevational view, turning 90 degrees, showing a solder notch is embedded by the solder joint.

Referring now to FIGS. 16 and 17, according to a fourth embodiment of the present invention, a solder notch C28 is defined in a solder portion C26 of a contact terminal C20. As shown in FIG. 17, once a solder ball C30 is melted, the solder notch C28 will be completely embedded within the solder joint such that a robust and reliable interconnection between the contact terminal C20 and a printed circuit board C40 is readily achieved.

The contact terminals described above through different embodiments can be readily and conveniently fabricated with the following steps, including the steps of initially providing an elongate strip of electrically conductive material stamped from a sheet with a lower portion, an upper portion and intermediate contact portions. The strip is then going through different work stations such that all those configurations, such as the contact engaging arm, the base portion and the curvilinear solder portion including all the details can be consecutively created. The contact terminal is kept connected to a carrier of the strip for cleaning and plating. The contact terminals are removed or severed after each and every contact terminals are assembled to a connector housing.

Before the contact terminals can be assembled and inserted into the passageways defined in the connector housing, since the contact terminals is made from phosphor bronze or the like, it is necessary to have it treated with certain nominal processes, including plating the strip along with the contact terminals with a layer of nickel to a thickness of nominal thickness. Then, the contact engaging arm is partially plated with nobel metal, such as gold, and palladium or the like for ensuring reliable interconnection with a mated electronic device. Normally, the solder portion or curvilinear lobe can be ready for receiving solder ball thereto since the solder ball can be properly fused to the nickel layer if the solder ball is fused to the solder portion not long after the connector is manufactured. However, since the present invention features a mechanic attachment of the solder ball to the solder portion, the solder ball may not be fused to the solder tail right after the connector is manufactured. It properly will wait some time on the shelf till the connector is mounted to a mother board through the soldering process. Nevertheless, once the nickel layer is in contact with the oxygen in the air, the nickel layer is oxidated into nickel oxide which makes the solder ball a little bit difficult to be fused to. In order to over come this inadvertent phenomenal and ensure a robust and reliable fusion between the solder ball and the solder portion, a layer of tin, or gold can be plated onto the solder portion to ensure the solder ball to be readily and reliably fused thereto, of course including the mother board.

Figure 18:
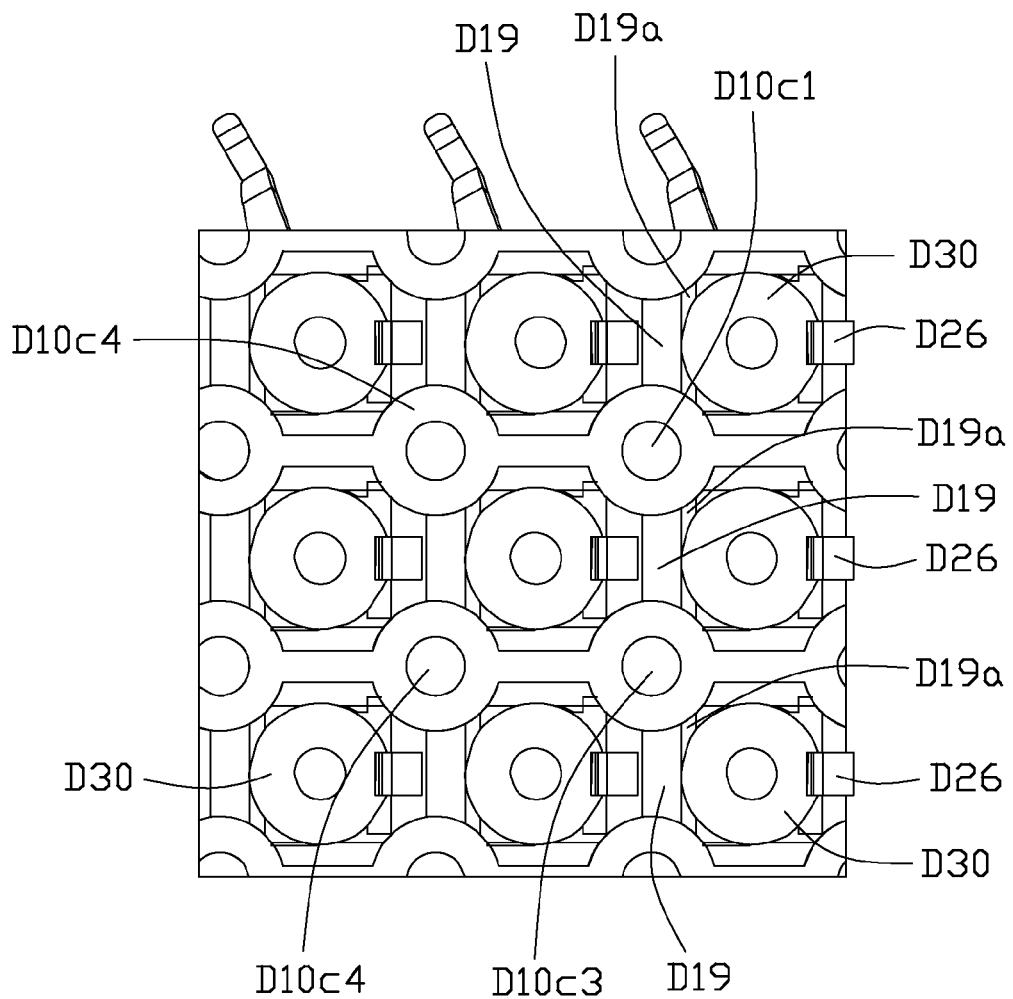
FIG. 18 is a bottom view of a socket connector made in accordance to a fourth embodiment of the present invention.
Figure 19:
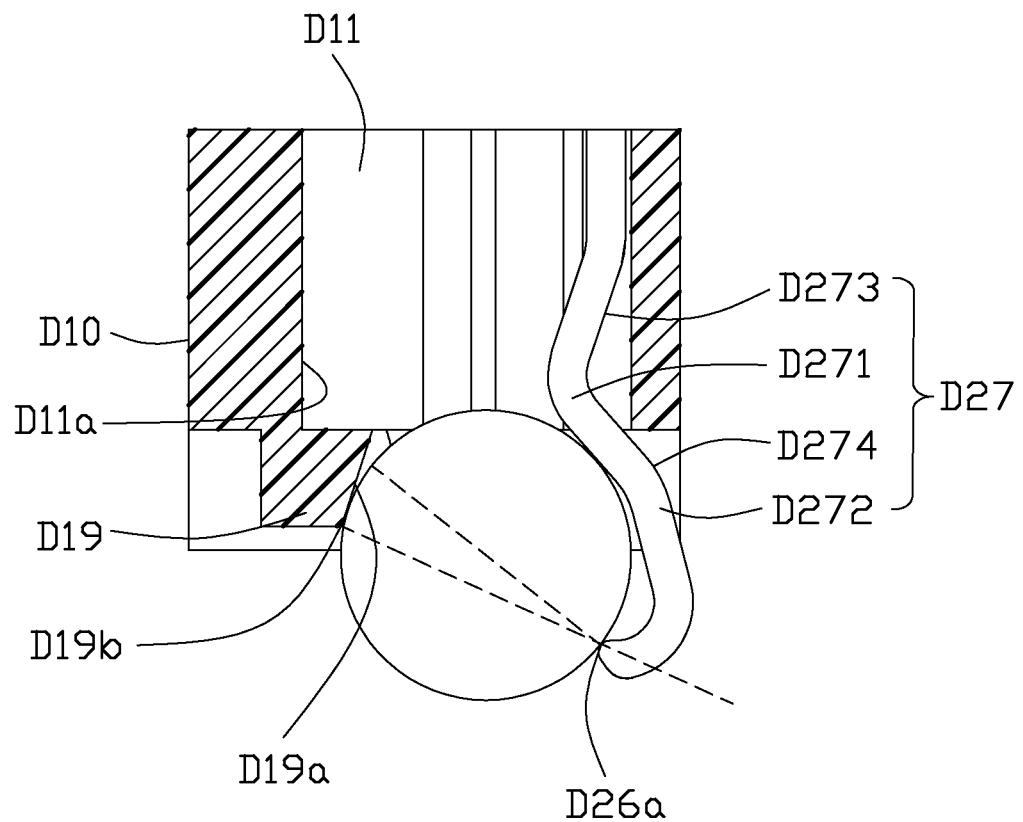
FIG. 19 is a cross sectional view of a passageway showing a relationship between a lower portion of the passageway, a curvilinear solder portion disposed in the passageway, and a solder ball properly secured between the lower portion of the passageway and the curvilinear solder portion.

Now referring to FIGS. 18 and 19, a partially shown socket connector D1 is shown, and featured a solder ball encampment D19 at a mounting surface D10a of the socket connector D1.

The solder ball encampment D19 is a structure integrally formed below the mounting surface D10a and slightly narrows the passageway D11 in its lower end, as typically shown in FIG. 19. The encampment D19 is in fact an extension D19 formed on the mounding surface D10a which extends across over a side wall D11a of the passageway D11 opposite to the curvilinear lobe D26. The extension D19 basically narrows down the lower opening of the passageway D11. The extension D19a further includes an inclined surface D19a opened outward. As shown in the dotted line, the solder ball D30 can be readily and securely encamped between the curvilinear lobe D27 and the inclined surface D19a of the extension D19. On the other hand, it can be readily appreciated from FIG. 19 that a Center of the solder ball D30 is located above from a line drawn from a tip D19b of the inclined surface D19a, and the tip D26a of the curvilinear lobe D26.

Figure 5:
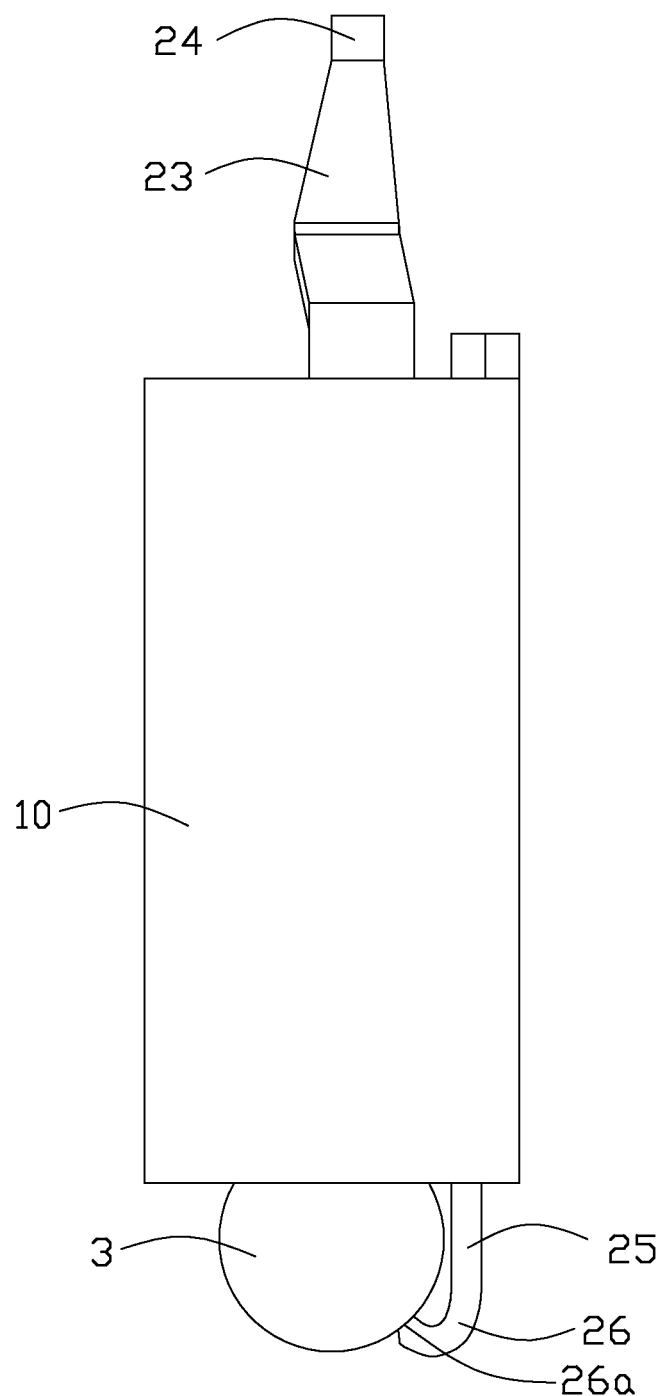
FIG. 5 is a side view of the partially-shown socket connector.
Figure 11:
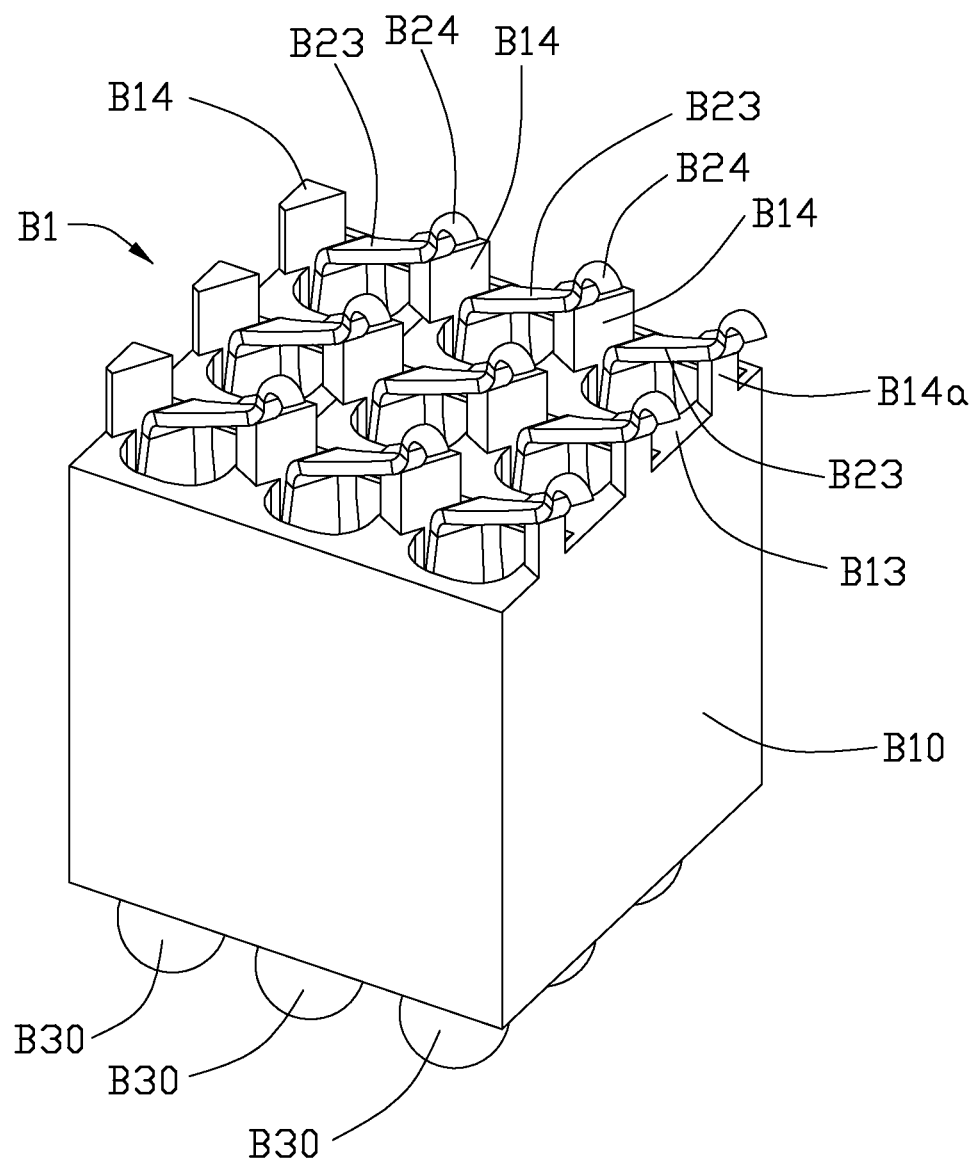
FIG. 11 is a perspective view of a partially shown socket connector in accordance to a third embodiment of the present invention.
Figure 11A:
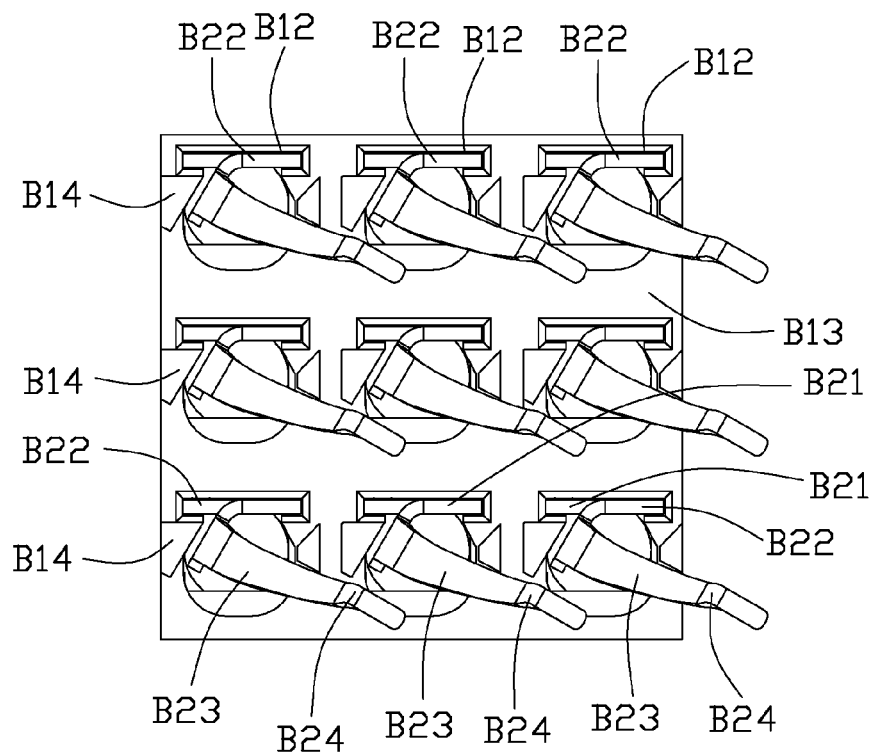
FIG. 11A is a top view of the socket connector shown in FIG. 11.

In addition, in this embodiment, the wave arrangement D27, which includes a peak D271, a first slope D272, and a second slope D273, generally includes a second and auxiliary peak D274 at the first slope D271 moving the tip D26a of the curvilinear lobe D26 closer to the solder ball D30, if the second peak D274 is not formed. As clearly shown in FIG. 19, the inclined surface D19a and the formation of the peak D271 jointly prevent the solder ball D30 from going further into the passageway D11. As one of issues encountered by the mechanical attachment of the solder ball D30 is accidentally pushing the solder ball D30 into the passageway D11. As shown in FIGS. 11 through 13 of U.S. Pat. No. 6,024,584 issued to Lemke on Feb. 15, 2000, a partition within the passageway is formed to prevent the solder ball from further into the passageway. U.S. Pat. No. 6,042,389 issued to Lemke on Mar. 28, 2000 discloses a similar design, such as shown in FIGS. 4 and 5. While in U.S. Pat. No. 6,572,397 issued to Ju on Jun. 3, 2003, a lower portion of a contact is formed into a cap shape to hold and limit the solder ball, as shown in FIGS. 6 and 11. In comparison, the use of the arrangement of curvilinear lobe D26, the wave arrangement D27, and the encampment D19 properly secure the solder ball D30 therebetween, and even ensure a reliable and robust tear-shaped solder joint, such as shown in FIG. 10 of the present invention. On the other hand, the peak D272 and the extension D19 jointly define a narrow passage entering the passageways D11 from mounting surface D10a.

As still referring to FIG. 18, a bottom view of the socket connector D1, it can be readily seen that along with the encampment D19 is a plurality of disks D10c1, D10c2, and D10c3, typically reference marked. As it can be readily see from FIG. 18, the extension D19 is in fact arranged between the disks D10c1, D10c3 and D10c2, D10c4. The provision of the disks D10c1, D10c3 and D10c2, D10c4 smooth the formation of the passageway D11 during the molding process. In addition, the disks D10c1 and D10c4 can be selectively hollowed so as to control warpage of the housing D10.

Figure 20:
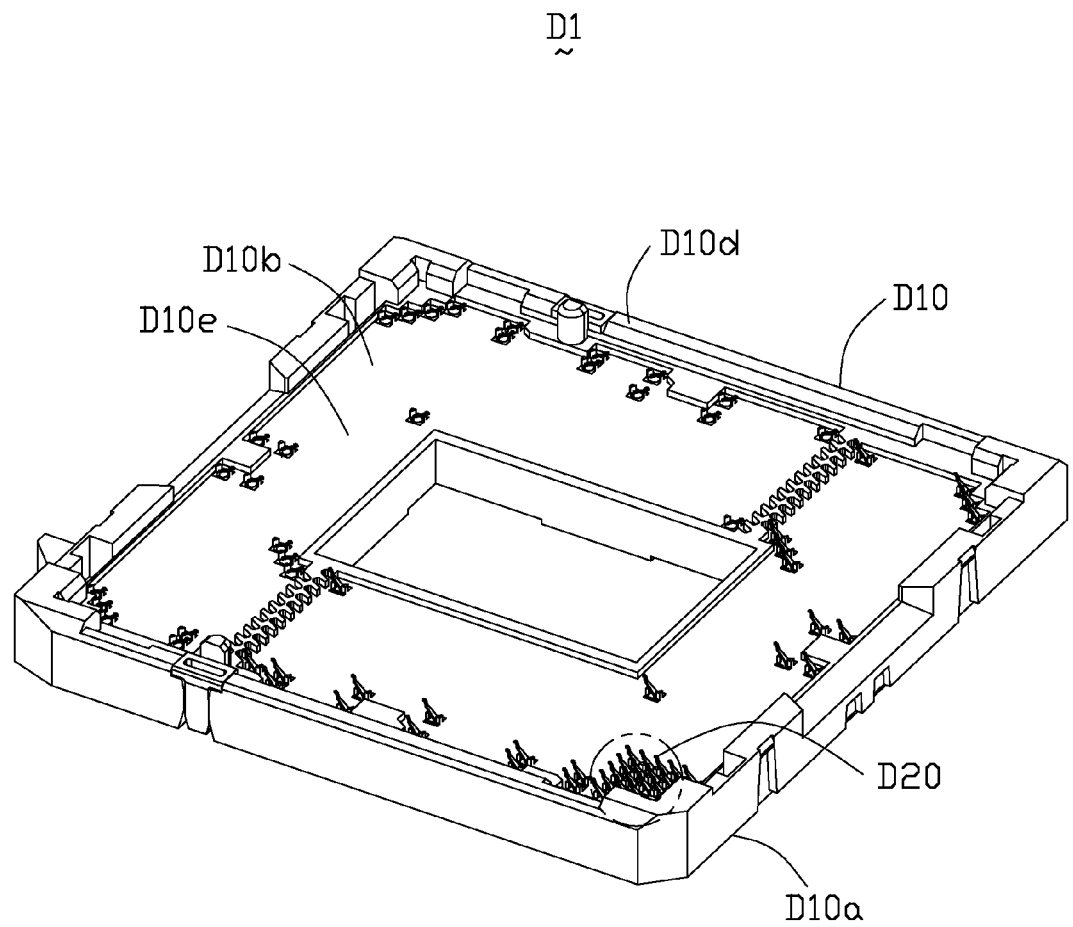
FIG. 20 is a perspective view of a socket connector implemented the features of the current invention in which contact engaging arms are partially shown for illustration.

FIG. 20 illustrates the socket connector D1 in full with a portion of contact terminals D20 is shown. It can be readily appreciated that the socket connector D1 includes an insulative housing D10 with a plurality of passageways D11 defined between a mating interface D10b, and a mounting surface D10a. Peripheral walls D10d surrounds the mating interface D10b therefore defining a cavity D10e for receiving an IC package, i.e. the so-called CPU. The peripheral walls D10d is further defines with notches D10f for easy accessing of the CPU to have it removed from the cavity D10e.

Figure 21:
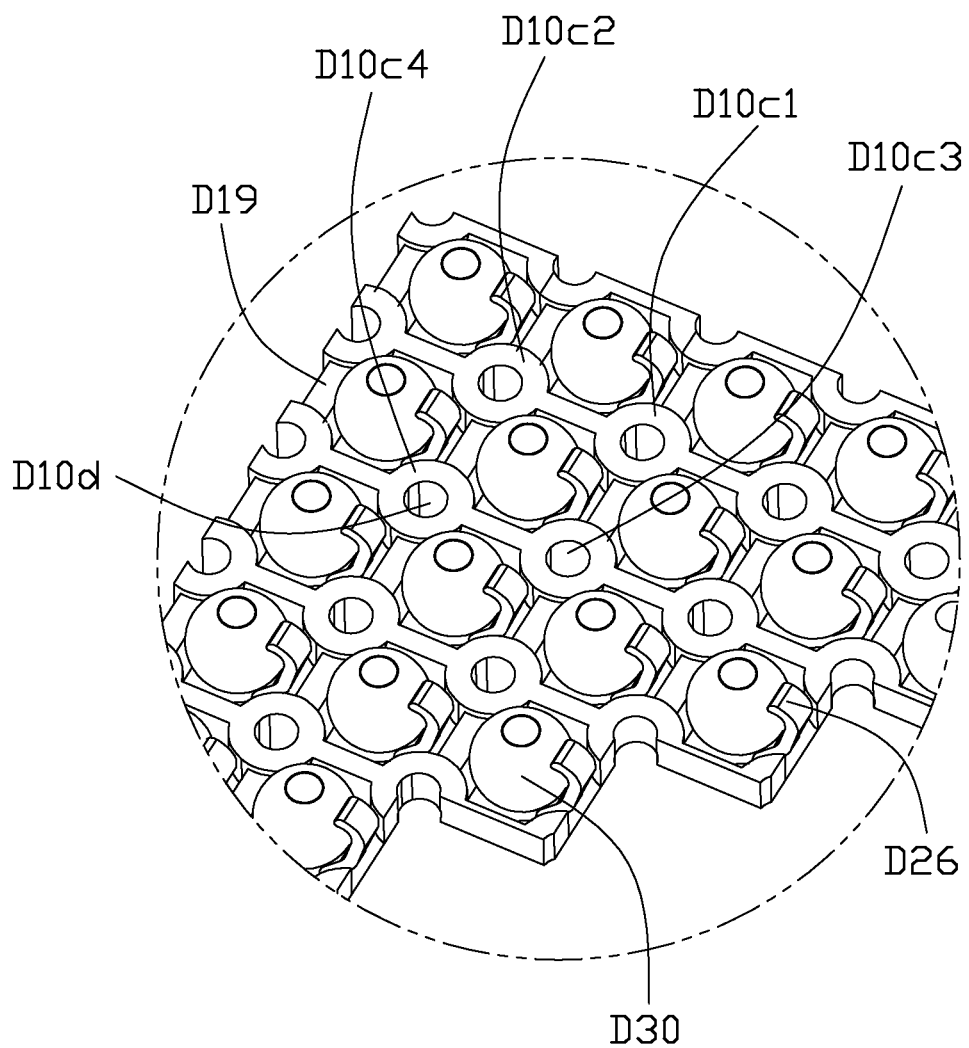
FIG. 21 is a bottom view of the socket connector shown in FIG. 20.

FIG. 21 illustrates a bottom of the socket connector D1 in portion. It can be seen that the disks D10c1, D10c3 and D10c2, D10c4 can be served as a standoff on the mounting surface D10a for properly supporting the socket connector D1 after the solder ball D30 is melted.

Figure 22:
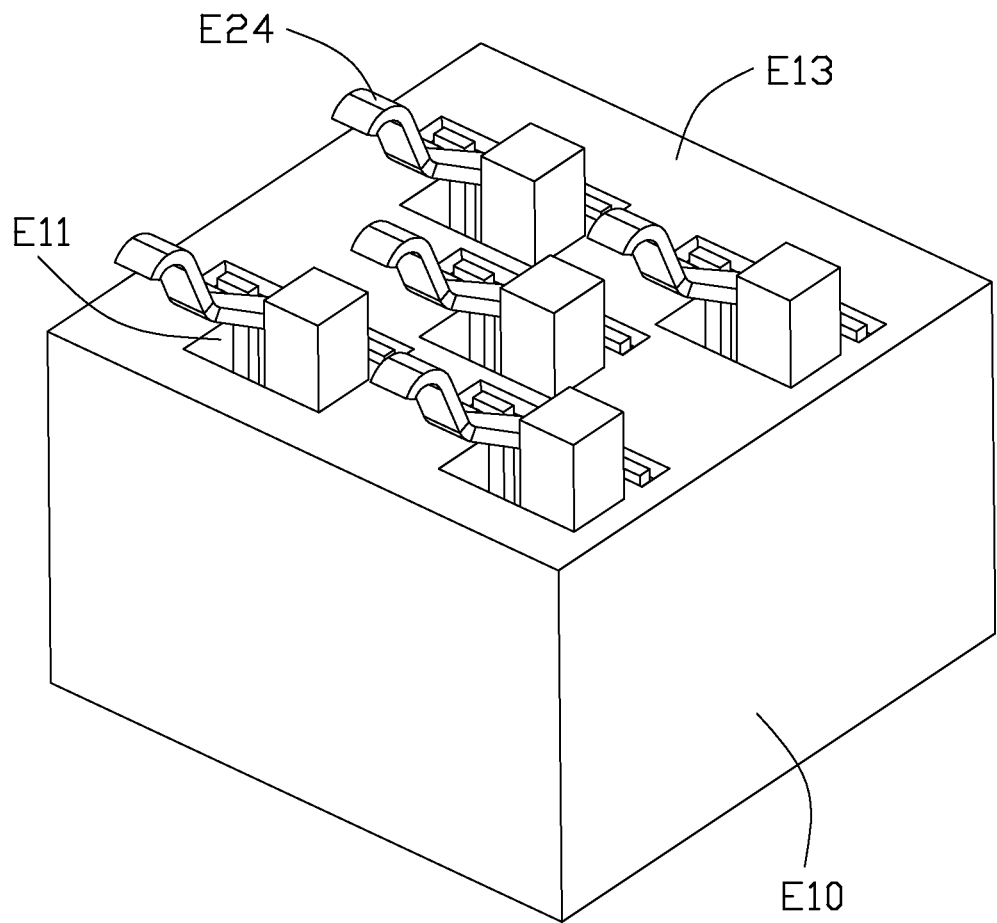
FIG. 22 is a perspective view of an electrical connector in accordance with a fifth embodiment of the present invention.
Figure 23:
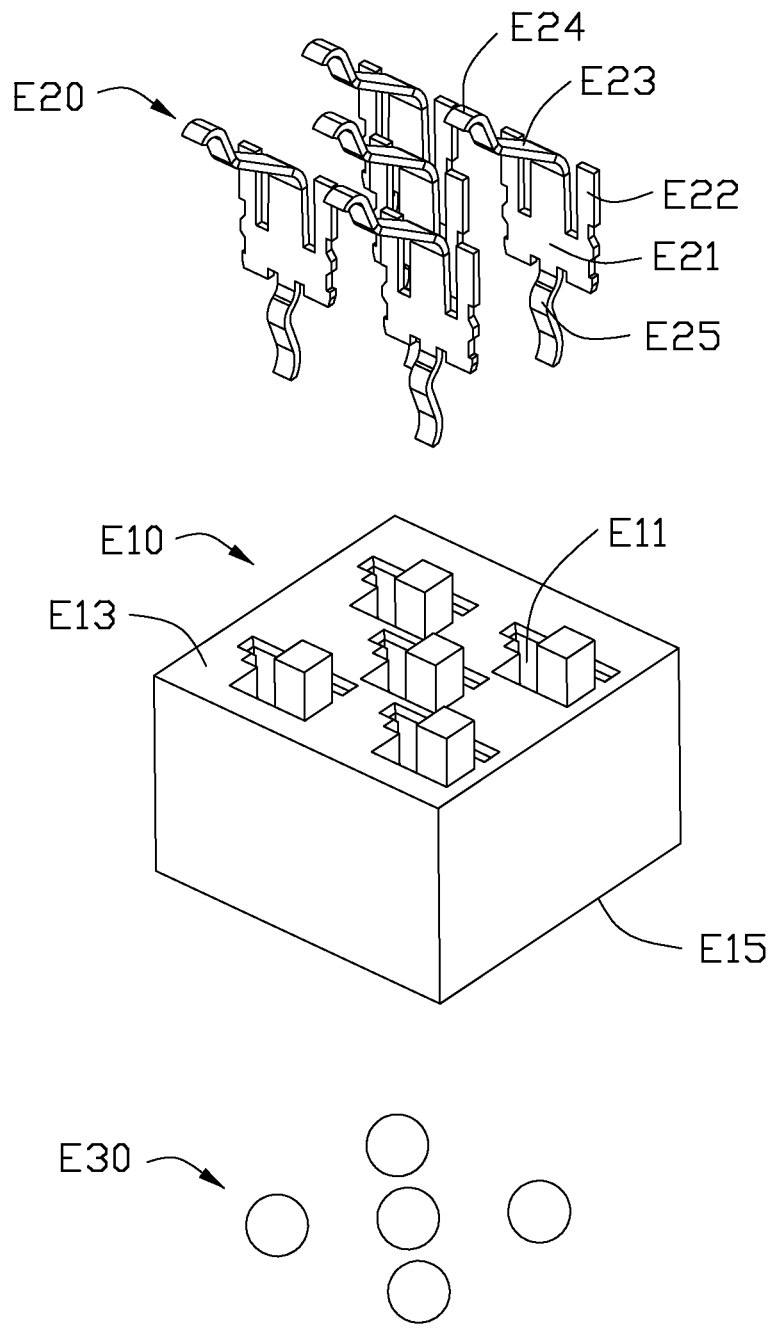
FIG. 23 is an exploded perspective view of the electrical connector shown in FIG. 22.
Figure 24:
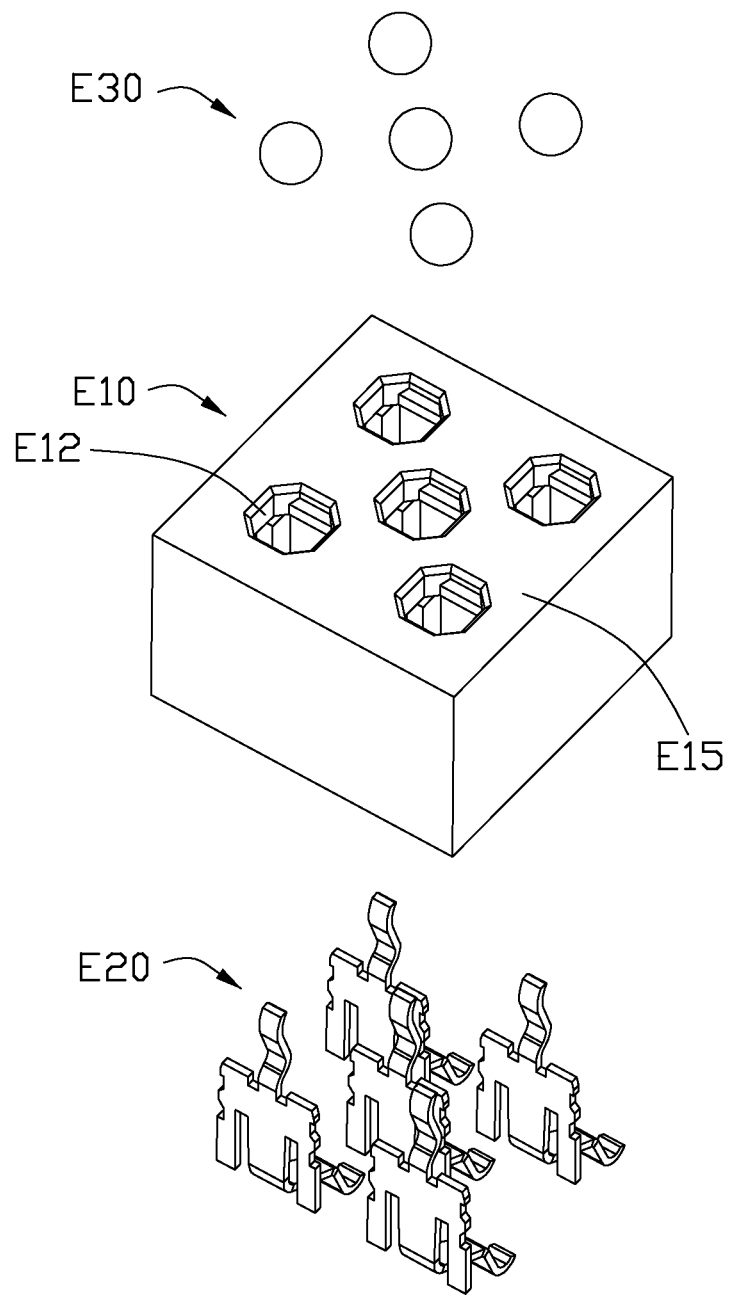
FIG. 24 is another exploded perspective view of the electrical connector of FIG. 22 taken from a different angle.
Figure 25:
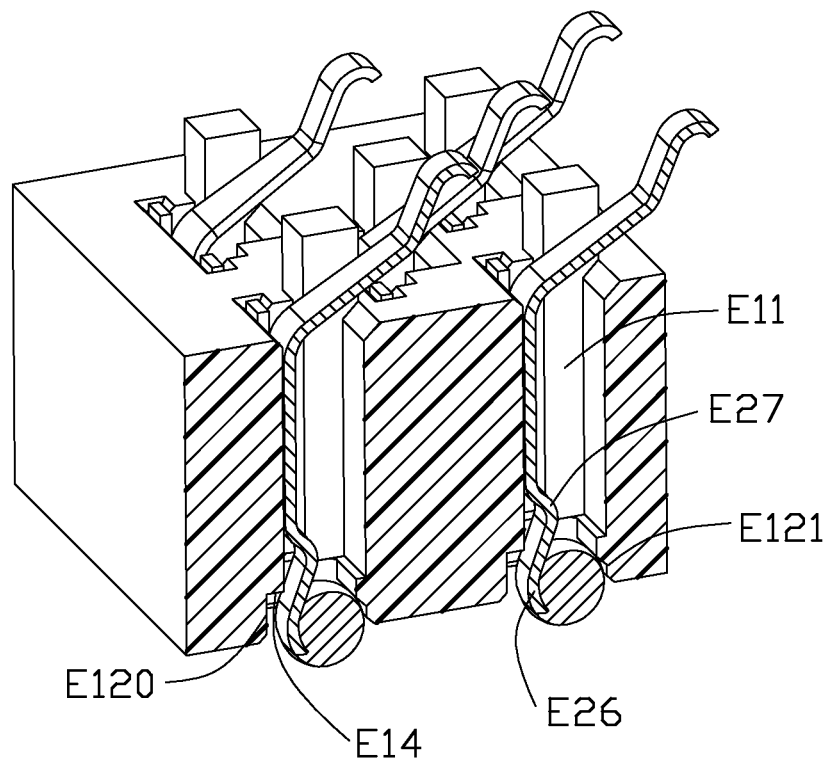
FIG. 25 is a cross-sectional view taken along line 22-22 of FIG. 22.
Figure 26:
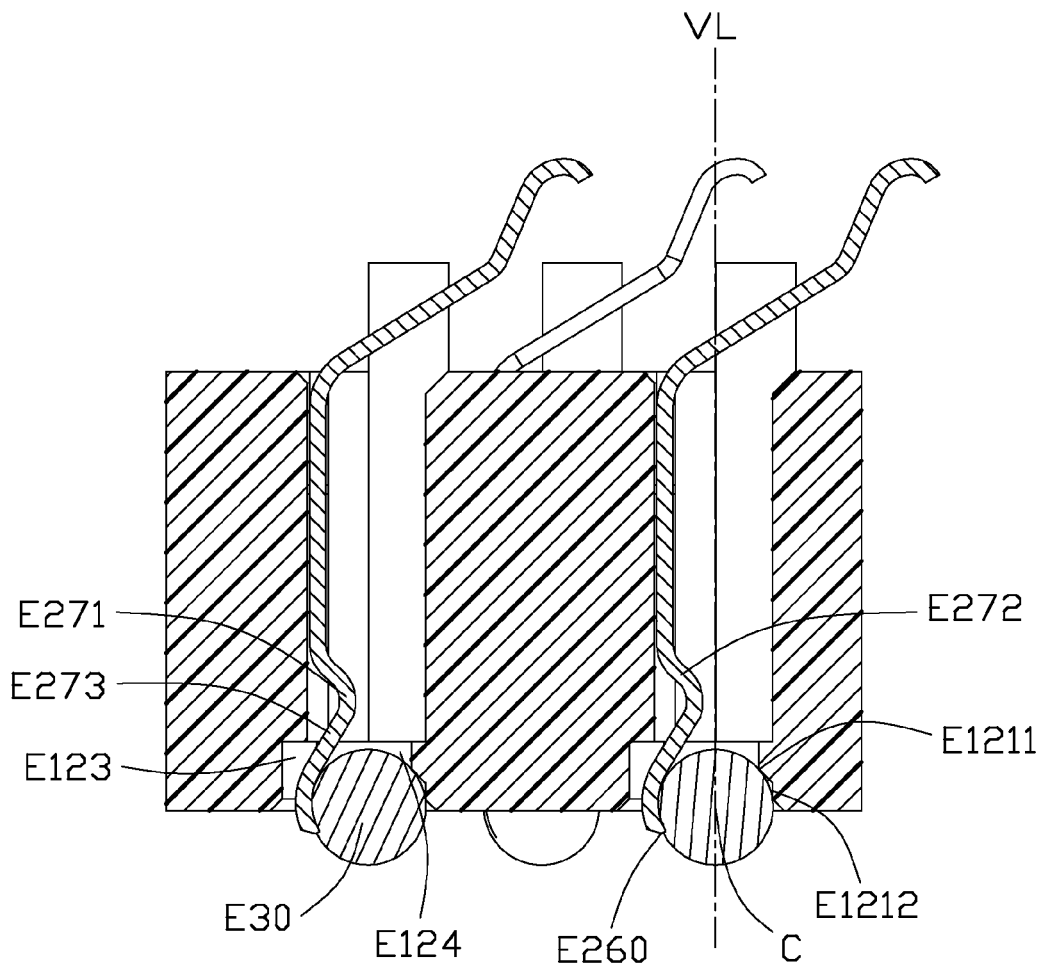
FIG. 26 is similar to FIG. 25 but taken from a different angle.

FIGS. 22, 23 and 26 illustrate an electrical connector in accordance with a fifth embodiment which comprises an insulative housing E10 and a plurality of contacts E20 received in the insulative housing E10. Please referring to FIGS. 23-24, the contact E20 has a plate-like base portion E21 with a plurality of barbs at opposite sides thereof, a retaining section E22 extending upwardly from the base portion E21, and a contact engaging arm E23 projecting upwardly from the base portion E21 with a contact tip E24 at a top end thereof. A solder portion E25 extends downwardly from the base portion E21 and has an upper wave arrangement E27 and a lower tail E26 extending downwardly and laterally from the wave arrangement E27. The wave arrangement E27 and the contact engaging arm E23 are located at a same side of the base portion E21. The tail E26 contacts with a solder ball E30 at a point E260 thereof for securing the solder ball E30.

With reference of FIGS. 22-27, the insulative housing E10 has opposite upper and lower surfaces E13, E15 and a plurality of through holes extending therethrough. The through holes in one row are staggered with the through hole in an adjacent row. The through hole includes a passageway E11 and a retaining slot E12 communicated with each other and defining an inner step surface E14 facing the lower surface E15. The base portion E21 and the retaining portion E22 are arranged at a first of the passageway E11. The retaining slot E12 has a vertical surface E120 and a slant surface E121 facing opposite to the vertical surface E120. The tail E26 is located adjacent to the vertical surface whereby forming a deforming space E123 so that the tail E26 can move laterally for disposing the solder ball E30. A receiving space E124 is formed between the tail E26 and the slant surface E121 for receiving the solder ball E30. The slant surface E121 has two contact points E1211, E1212 abutting with the solder ball E30 a lower points E1212 is below a center C of the solder ball E30 and an upper point E1211 is higher than the center C. The base portion E21 and the solder portion E25 are disposed between the first side of the through hole and a vertical line VL passing though the center C of the solder ball E30.

The tail E26 projects to the first side of the through hole, and the wave arrangement E27 projects from the base portion E21 to a second side of the through hole opposite to the first side. The wave arrangement E27 defines a peak E271 and two curvilinear lobes E272, E273 at opposite sides of the peak E271. The two curvilinear lobes E272, E273 are connected with the base portion E21 and the tail E26. The base portion E21 and the wave arrangement E27 are received in the passageway E11, and the tail E26 and solder ball E30 are disposed in the retaining slot E12. The contact engaging arm E23 extends beyond the upper surface E13, and the tail E26 and the solder ball E30 extend out of the lower surface E15.

As disclosed FIGS. 6-27, the base portion and the solder portion are disposed between on one side of the insulative housing and a vertical line passing though a center of the solder ball. The wave arrangement or the tail/curvilinear lobe each defines a space with the insulative housing so that the contact deforms and the tail/curvilinear lobe moves in the through hole. Then the tail/curvilinear lobe and the insulative housing define an entrance for the solder ball.

Figure 27A:
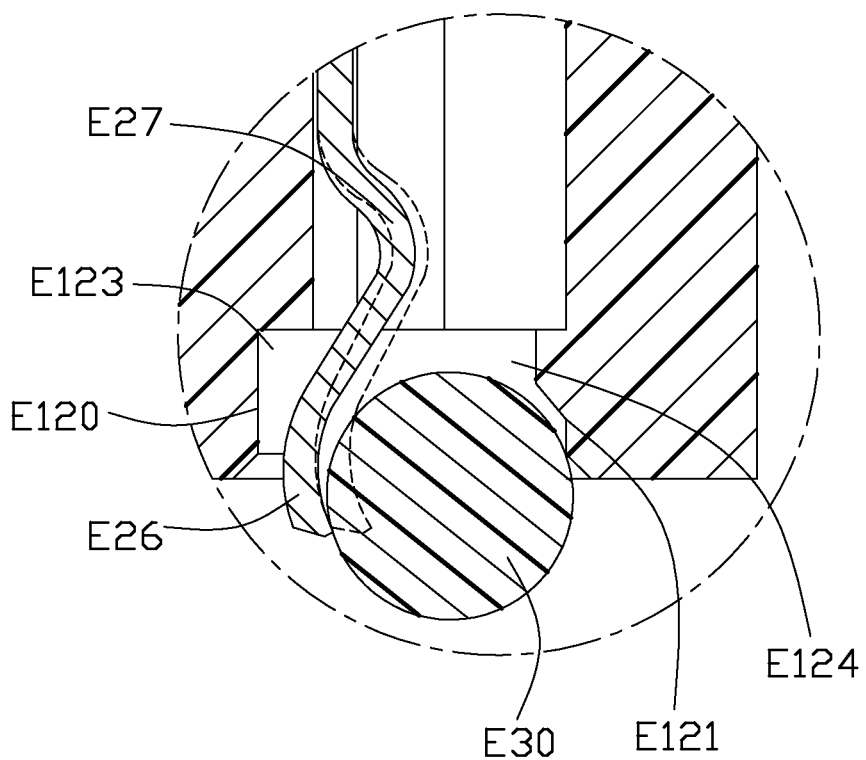
FIG. 27A is an enlarged view of the circle portion of FIG. 26.
Figure 27B:
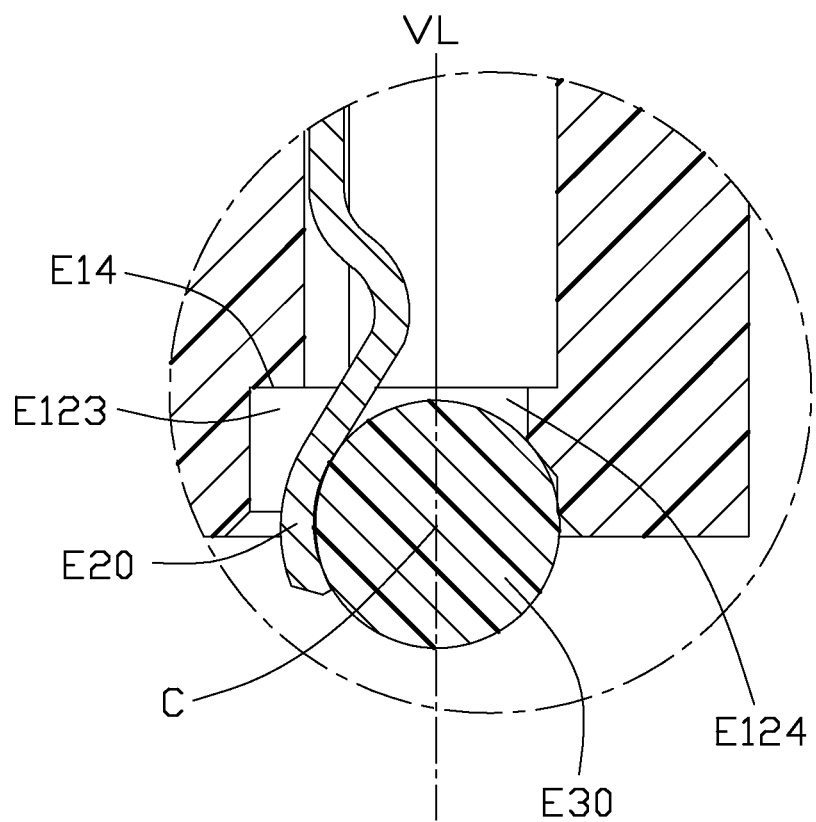
FIG. 27B is similar to FIG. 27A while illustrates the tail of the contact deformed during disposing the solder ball.

When the solder ball is inserted, the tail/curvilinear lobe has an elastic deformation thereby enlarging the entrance so that the solder ball passing. Then the tail/curvilinear lobe defined by the tail/curvilinear lobe and an inner surface of the through hole so than the solder ball can be inserted in the receiving space and clasped by the tail/curvilinear lobe and the insulative housing. That is to say, before inserting the solder ball, the tail/curvilinear lobe is located at a first position which is shown by the dotted line in FIG. 27A. During the insertion of the solder ball, the tail/curvilinear lobe is deformed and moves to enlarge the entrance by the solder ball. The tail/curvilinear lobe has a biggest deformation at a second position as shown by the solid line of FIG. 27A. Then the solder ball can be inserted until it is clasped by the tail/curvilinear lobe and the insulative housing. At this time, the tail/curvilinear lobe is located at a third position which is located between the first and positions as shown in FIG. 27B.

Since the tail/curvilinear lobe and the solder ball has at least one contact point below a center of the solder ball thereby provides an upward supporting force of the solder ball. The inner surface of the through hole and the solder ball has at least one contact point on the top of the center of the solder ball which prevents the solder ball from move upwardly. Moreover, the tail/curvilinear lobe and the insulative housing located at opposite sides of the solder ball further limit a horizontal movement of the solder ball.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

The invention claimed is:

1. An electrical connector for connecting an electronic package and a printed circuit board, comprising:
    an insulative housing defining a plurality of passageways extending therethrough in a vertical direction between opposite upper and lower surfaces thereof;
    a plurality of contacts disposed in the corresponding passageways, respectively, each of the contacts defining a base portion retaining to the housing, an upper contacting section extending upwardly from the base portion and beyond the upper surface for contacting the electronic package, a tail section, with a waveform thereof, extending downwardly from the base portion to hold a solder ball for connecting to the printed circuit board; wherein
    in a side view, around a bottom portion of each passageway and for each solder ball, the housing provides a vertical wall and a downward oblique wall above said vertical wall to contact one lateral side of the corresponding solder ball at two respective points, and the waveform compliantly abuts against another lateral side of the corresponding solder ball.

2. The electrical connector as claimed in claim 1, wherein a lower half of the solder ball is exposed under the bottom surface of the housing.

3. The electrical connector as claimed in claim 2, wherein a bottom end of the solder ball is located below a tip of the tail section of the corresponding contact which is located below the bottom surface of the housing.

4. The electrical connector as claimed in claim 2, wherein a chamfered structure is formed at a bottom end of the passageway around the bottom surface of the housing.

5. The electrical connector as claimed in claim 1, wherein around the bottom portion of each passageway, another vertical wall is located above the downwardly oblique wall.

\* \* \* \* \*